(12) United States Patent  (10) Patent No.: US 6,493,864 B1
Liu  (45) Date of Patent: Dec. 10, 2002

(54) INTEGRATED CIRCUIT BLOCK MODEL REPRESENTATION HIERARCHICAL HANDLING OF TIMING EXCEPTIONS

(75) Inventor: Dean Liu, San Jose, CA (US)

(73) Assignee: Ammocore Technology, Inc., Santa Clara, CA (US)

( * ) Notice: Subject to any disclaimer, the term of this patent is extended or adjusted under 35 U.S.C. 154(b) by 0 days.

(21) Appl. No.: 09/886,164

(22) Filed: Jun. 20, 2001

(51) Int. Cl.[7] .............................................. G06F 17/50
(52) U.S. Cl. ................... 716/18; 716/7; 716/6
(58) Field of Search ................. 716/2, 6–10, 14–18

(56) References Cited

U.S. PATENT DOCUMENTS

| | | | |
|---|---|---|---|
| 5,463,562 A | * 10/1995 | Theobald | 716/7 |
| 5,740,347 A | 4/1998 | Avidan | |
| 5,867,396 A | * 2/1999 | Parlour | 716/18 |
| 6,093,214 A | 7/2000 | Dillon | |

* cited by examiner

Primary Examiner—Don Wong
Assistant Examiner—Wilson Lee
(74) Attorney, Agent, or Firm—Anthony T. Cascio

(57) ABSTRACT

In a block model abstraction of an integrated circuit developed from a hierarchal netlist, the hierarchal handling of timing exceptions is accomplished by selecting certain nodes not viewable at the top level in accordance with a set of rules, and raising these nodes to the top level so that defined timing exceptions may be applied. The timing model is next generated, and exception signatures created for paths between the selected nodes. Signatures are then removed from paths were such signature would not otherwise be valid.

88 Claims, 7 Drawing Sheets

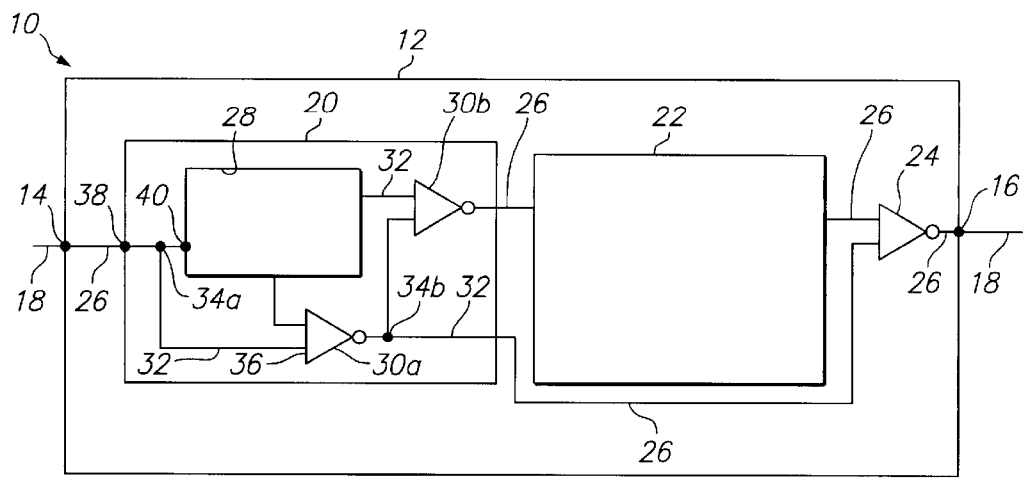
FIG. 1
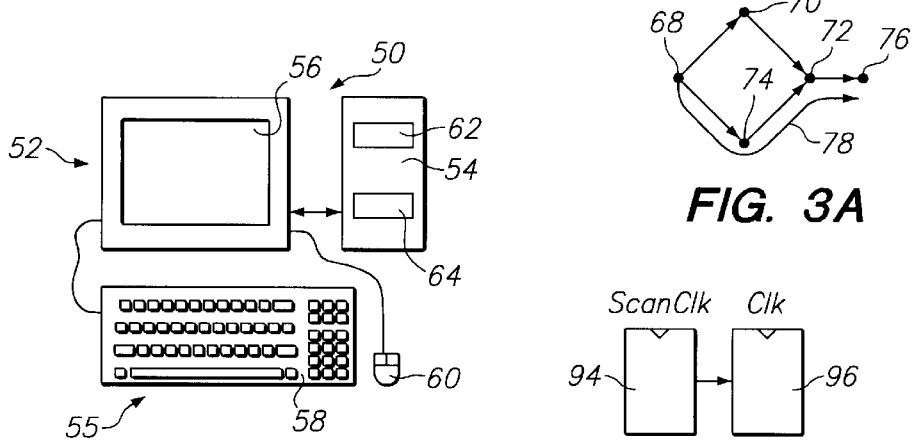
FIG. 2
FIG. 3A
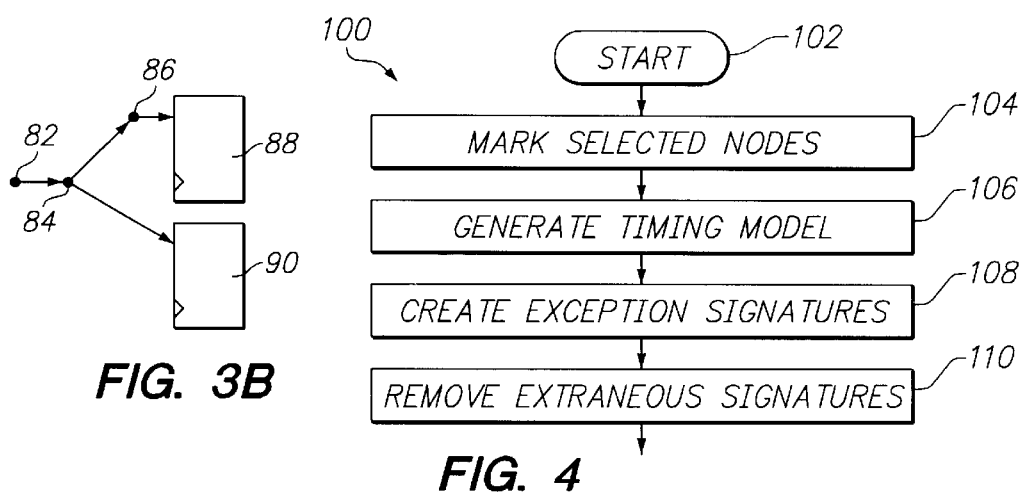
FIG. 3B
FIG. 3C
FIG. 4

INTEGRATED CIRCUIT BLOCK MODEL REPRESENTATION HIERARCHICAL HANDLING OF TIMING EXCEPTIONS

RELATED APPLICATIONS

The present application incorporates herein by reference copending, commonly owned, U.S. application for "Standard Block Architecture For Integrated Circuit Design," Ser. No. 09/525,184, filed Mar. 14, 2000.

BACKGROUND OF THE INVENTION

1. Field of the Invention

The present invention relates generally to semiconductor design apparatus and processes and, more particularly, to novel apparatus and methods for hierarchal handling of timing exceptions in a block model representation of an integrated circuit.

2. Description of the Background Art

During the performance of simulation and analysis of an integrated circuit, a block model representation of the integrated circuit is used. Each block model is an abstraction of a section of the integrated circuit. The abstraction is typically viewed on a display monitor of a workstation user interface, wherein the workstation reads data from an appropriate computer readable medium associated with the workstation. The medium may be internal to the workstation or readable over a local area, wide area, or public computer network.

The data, which is read, is commonly referred to as a netlist, the netlist being a textual representation of the contents of one block model. The netlist contains objects, which textually set forth the instances, modules, cell, terminals, ports, and nets and net segments, as well as the interrelation among them, thereby textually defining the block model.

Typically, the netlist is hierarchal. In a hierarchal netlist, the textual representation of the block model maintains only one copy of a module that may be used in multiple locations within the block model. When displayed in the user interface, the block model generated from the hierarchical netlist would show basic and non-repetitive devices in schematic form, and also would show each instance of the more complex and repetitive circuit modules as black box modules with only their input and output ports. The black box modules, although masking the complexities of the circuits therein, provide a known function between its input and output ports.

In the black box module, the allowed timing paths are either combinatorial or sequential. A combinatorial path proceeds from an input pin of the black box to an output pin, passing only through combinatorial logic. The combinatorial paths are modeled as pin to pin delays. A sequential path represents a convergence of data and clock inputs presented at multiple input pins, passing through clocked devices such as latches and gates, to an output pin. The sequential paths are modeled using setup and hold times, and may also include slope and load dependent delays with respect to the driving of an input or output pin.

Typically, a timing model is generated for each block model, and then subsequently the timing model for each block is combined with the timing model for each other block to determine the timing for the full chip. In generating the timing model for each block, it may be necessary to define certain timing path exceptions and exception operands for the block model.

For example, in a block model which may have two input pins, In1 and In2, and two output pins, Out1 and Out2, it may be necessary to define for one exception the path between In2 and Out1 as being disabled. The details of the path between these two pins cannot be seen at the top level block model since the path may contain instances of black box modules and lower level nodes within such modules. It may nonetheless be necessary to carry this exception along one or more paths between these instances and nodes to generate the timing model. It thus becomes desirable to see into the block model and raise such instances and nodes to the top level to define the timing exceptions necessary and generate the timing model.

It is possible to use a flat netlist for the block model, wherein the flat netlist contains data for all devices within the block model, including redundant data for repetitively used modules, thereby eliminating any hierarchy. The block model when viewed would accordingly contain all elements of the circuit, thus making it possible to see all nodes in the block model at a single level. However, not all nodes may need to be visible to define the timing exceptions, but only selected ones of the nodes may be required. Accordingly, it would become necessary to store significant amounts of extraneous data when using the flat netlist. Furthermore, in the block model which abstracts a portion of a complex integrated circuit, the additional amounts of data required to be stored for the flat netlist may be disadvantageously and prohibitively large.

Accordingly, there is a need for apparatus and methods for hierarchal handling of timing exceptions. There is a need for apparatus and methods for selecting only such nodes within modules as required for viewing at the top level. There is also a need for apparatus and methods which minimizes the amount of data stored in a data file.

SUMMARY OF THE INVENTION

According to the present invention, in a netlist that includes a plurality of objects, wherein the objects include a plurality of instances and a plurality of nodes, a method for handling of timing exceptions within the circuit or block model comprises marking selected ones of the nodes, generating a timing model having a plurality of timing arcs wherein each of the timing arcs are between any two of the selected ones of the nodes, creating exception signatures for the timing exceptions to be carried in the timing model in association with the timing arcs, and removing extraneous ones of the exception signatures from association with the timing arcs.

In one aspect of the present invention, the method set forth above may be implemented by a program embedded in a computer readable medium. The program when executed reads data, which may be contained in memory or in a readable file, containing information relating to the circuit or block model, similar to the description of the circuit or block model set forth above, and implements the above described method for hierarchal handling of user or software program inputted timing exceptions.

In another aspect of the present invention, a computer system for hierarchal handling of timing exceptions comprises a computer workstation including a user interface having at least a display monitor and an input device, and a storage medium usable by the workstation, wherein the medium includes data readable by the workstation and program code readable and executable by the workstation. The data contains information of a circuit or a block model similarly as set forth above. The program code causes the circuit or block model to be displayed on the monitor and further causes the input device to be responsive to a user inputted timing exceptions within the circuit or block model when displayed. The program code in response to the timing exceptions being inputted then causes the workstation to mark selected ones of the nodes. Next, the program code in response to the selected ones of the nodes being marked causes the workstation to generate a timing model having a plurality of timing paths wherein each of the timing paths are between any two of the selected ones of the nodes. Thereafter, the program code, in response to the timing model being generated, causes the workstation to create exception signatures for the timing exceptions to be carried along the timing paths. Finally, the program code in response to the exception signatures being created causes the workstation to remove extraneous ones of the exception signatures from the timing paths.

A feature of the present invention is that the selected ones of the nodes, which are marked, are made visible at the top level of the hierarchy irrespective of the level at which the marked nodes may be within the netlist. Exception signatures may now be carried along paths between these nodes. Another feature of the present invention is that extraneous exceptions signatures, being those signatures along paths wherein they could not exist, are removed from the data. Another feature of the present invention advantageously limits the amount of data that would be necessary when using a flat netlist wherein all nodes and modules are visible.

These and other objects, advantages and features of the present invention will become readily apparent to those skilled in the art from a study of the following Description of the Exemplary Preferred Embodiments when read in conjunction with the attached Drawing and appended Claims.

BRIEF DESCRIPTION OF THE DRAWINGS

FIG. 1 is a graphical representation of an exemplary netlist useful set forth the terminology used in the present application;

FIG. 2 is a schematic diagram of an apparatus useful to practice the procedures of the present invention;

FIG. 3A–C illustrates exemplary timing exceptions which may be applied to a netlist;

FIG. 4 is a flowchart useful to describe a preferred embodiment of a method according to the principles of the present invention;

DESCRIPTION OF THE EXEMPLARY PREFERRED EMBODIMENTS

Figure 5:
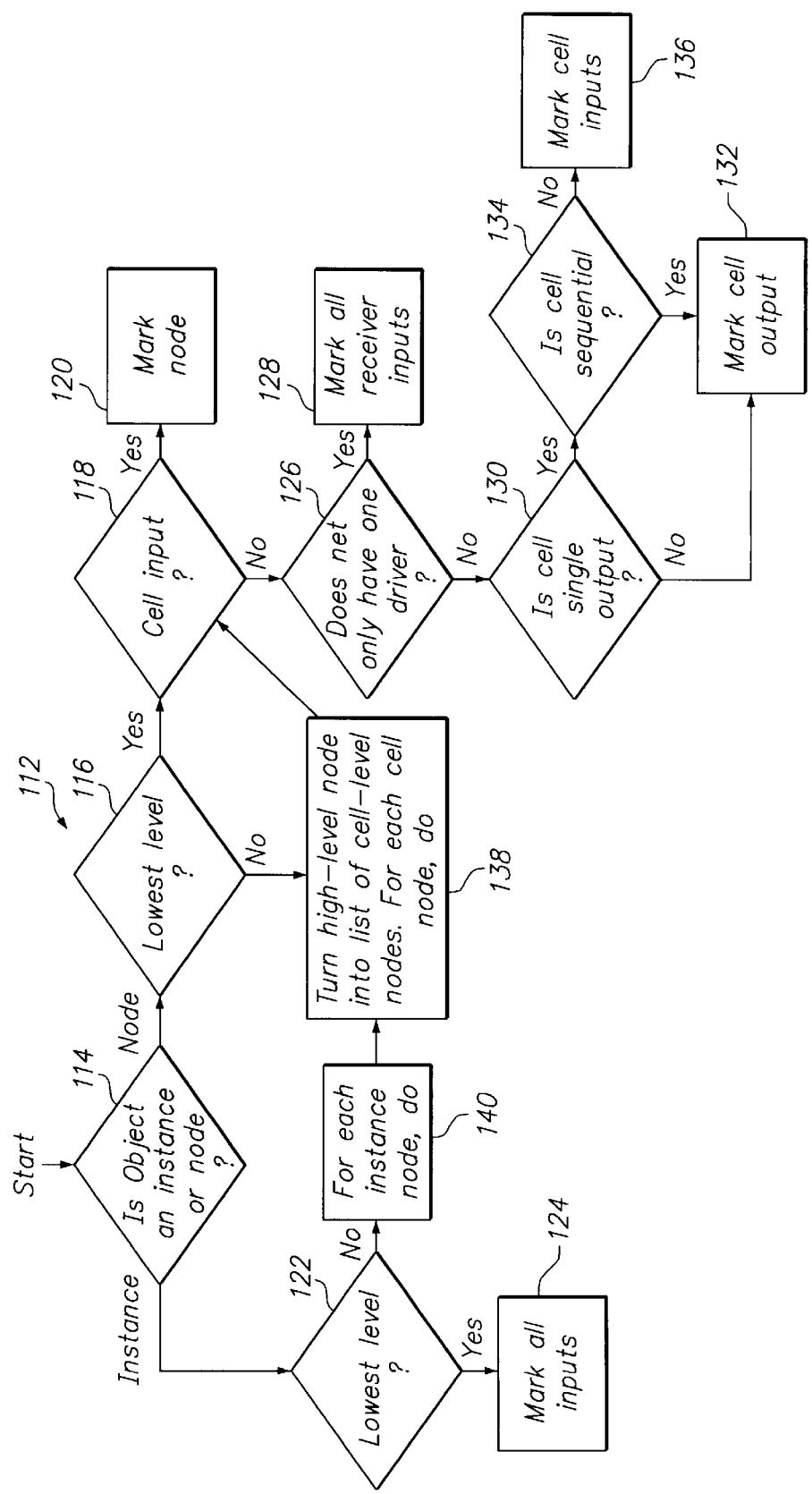
FIG. 5 is a flowchart useful to describe the step of marking of nodes of FIG. 4.

Referring now to FIG. 1, a portion of an exemplary block model 10 generated from a hierarchal netlist is shown. The description of the exemplary block model 10 is intended solely to set forth the terminology of the art as used throughout the disclosure of the present application. The description of the exemplary block model 10 is specifically intended not to be construed as any embodiment of the present invention or as any limitation upon the below described embodiments of the present invention.

As is known to those skilled in the art for any block model, the exemplary block model 10 may have a top level and a plurality of lower levels, wherein a lower level may reside at any hierarchal level below the top level. In the exemplary block model 10, there are three such levels shown, an upper level, an intermediate level and a deep level. Any number of other levels may exist in the hierarchal netlist of the block model 10 between a top level and the upper level, between the upper level and the intermediate level, and between the intermediate level and the deep level. There may also be further levels below the deep level until a bottom level is reached.

Generally, the common objects which a hierarchical netlist utilizes to represent a block model, block abstraction or an electronic circuit are: ports, instances, nodes and nets. By definition, an "instance" is a gate, module, standard cell, IP, or other block within some module, as well as their respective inputs and outputs at the same level. A "port" is an electrical interconnect between an instance and a level one up in the hierarchy. A net is comprised of one or more net segments, i.e., the interconnects between instances. Also referred to herein are leaf cell and leaf instance. A leaf cell is a standard cell, which by definition is always at the lowest level irrespective of the level in the netlist it is visible at. A leaf instance is an IP or other block that is also at the lowest level but not itself a standard cell.

At the upper level, the exemplary block model 10 may include a first module 12, an input port 14, an output port 16 and net segments 18. The exemplary block model may typically have other modules and instances visible at this level connected by the net segments 18.

At the intermediate level, the first module 12 may further have a second module 20, a third module 22, an instance 24, and net segments 26. At the deep level, the second module 20 may further have a fourth module 28, instances 30a, 30b and net segments 32.

Nodes are defined where net segments interconnect to each other. For example, in the deep level, nodes 34a, 34b are defined where the net segments 32 interconnect. At any node, there may be any number of instances connected to it, which are all electrically equivalent. For example, at node 34a, electrical equivalency is found along the net segment 32 between the node 34a and an input 36 of instance 30a, which may be a standard cell. Similarly, electrical equivalency is also found along the net segment 18 and at the input port instance 14 of the first module 12, as well as at an input port instance 38 of the second module 20 and an input port instance 40 of the fourth module 28. Finally, electrical equivalency is also found along the net segment 26 between the input port instance 14 and the input port instance 38, and along the net segment 32 between the input port instance 38 and the node 34a, and between the node 34a and the input port instance 40.

As will become apparent from the description set forth below, when developing a timing model for a block model, it becomes necessary to select certain nodes within the block model between which timing paths are defined. For example, the node 34a may be one such node to be selected. However, as described above, there are plurality of instances which are connected to the node 34a, which although are electrically equivalent in a static DC model, are not electrically equivalent when signal propagation delays, or other considerations as described below, are to be accounted for in the timing paths. In this example, a timing delay likely would exist between the input port instance 14 of the first module 12 and the input 36 of the standard cell 30a, although each of these instances is at the node 34a.

Accordingly, should the node 34a be one of the nodes to be selected for the timing model, it must be correctly marked for the timing model. One feature of the present invention is a set of rules described below, which may be heuristic or algorithmic, to determine which instance at the node 34a should be marked for the timing model when selecting the node 34a. In accordance with another feature of the present invention, whenever a node is marked, the marking makes such node visible at the top level of the hierarchy.

Referring now to FIG. 2, there is shown an exemplary computer system 50. The description of the exemplary computer system 50 is intended solely to set forth one possible apparatus upon which the below described methods of the present invention may be practiced. Accordingly, the description of the exemplary computer system 50 is specifically intended not to be construed as any limitation upon the below described embodiments of the methods of the present invention.

The apparatus of the present invention may be a computer readable medium that contains program code, which when read and executed performs the procedures set forth in the methods described below. Another apparatus of the present invention may be the below described components of the computer system 50 in which the procedures set forth in the methods described below are performed.

The computer system 50 includes a workstation 52 and a computer readable medium 54. The workstation 52 includes a user interface 55 having at least a display monitor 56 and input devices such as keyboard 58 and mouse 60. As used herein, the user interface 55 may refer to its component parts of monitor 56, keyboard 58 and mouse 60 individually or collectively as the context of the following description so dictates. Other details of the workstation 52 are well known to those skilled in the art, or commercially available, and, accordingly, need not be further described herein.

The medium 54 may include one or more hard disks in which data files and executable program code may be embedded, or may include volatile or nonvolatile memory in which data and code resides, for use by the workstation 52, or any combination thereof. The medium 54 may be internal to the workstation 52 or external to the workstation 52, such as on a local area, wide area or public network. The storage medium 54 may include data 62 readable and writeable by the workstation 52 and program code 64 readable and executable by the workstation 12.

Generally, when the computer system 50 as described above is used in the design and analysis of an integrated circuit, the data 62 may contain information of all or part of an integrated circuit. The program code 64 causes the workstation 52 to read the data 62 and display the contents of the data 62 on the monitor 56 of the user interface 55.

In a preferred exemplary embodiment, this information contained in the data 62 may be a hierarchal or flat netlist, each as discussed above, for a block model of such integrated circuit or any portion thereof. In another preferred exemplary embodiment, this information may also be the netlist for the "Standard Block" as described in the above referenced application. The term block model as used throughout this specification may refer to either a block model or Standard Block, unless specific reference is made to the Standard Block. The below described procedures of the present invention commence with timing exceptions being inputted into the information contained in the data 62 by either a user of the workstation 52 or by the program code 64.

With further reference to FIG. 3A–C, several examples of timing exception types which may be defined for a block model are set forth below. It is to be understood that these examples are presented for illustrative purposes only and are not intended to be exhaustive of all types of timing exceptions which may be defined. Furthermore, the applicability of the present invention is not to be limited to these exemplary timing exceptions. The exemplary timing exceptions are data items upon which the below described embodiments of the present invention act upon or in response to.

One type of exemplary timing exception may include the disabling of a path between terminals, or all paths through an instance or all paths through one term. With specific reference to FIG. 3A, there is shown a first example of possible paths within a block model having terminals 68, 70, 72, 74, and 76. The terminal 68 branches to terminals 70 and 74, each of which then converge to terminal 72. A single path is allowed between terminal 72 and terminal 76. Should a path 78 be the only allowed path from terminal 68 to terminal 76 (through terminal 74 and terminal 72), a timing exception needs to be defined that disables a path from terminal 68 to terminal 72 through terminal 70.

Another type of exemplary timing exception may disable a path along a defined multi-cycle path. With specific reference to FIG. 3B, there is shown another example of possible paths within a block model having terminals 82, 84 and 86, and gates 88 and 90. Should a path from terminal 84 to gate 90 be the only allowed path in this example, a timing exception from terminal 84 to gate 88 through terminal 86 needs to be defined.

Yet another type of timing exception type may disable a path between clock domains. With reference to FIG. 3C, there is shown an example of possible paths within a block with gates 94 and 96. The gate 94 resides in the scan clock (ScanClk) domain and the gate 96 resides in the clock (Clk) domain. A timing exception may be defined on the path between the gate 94 and the gate 96.

Still another type of timing exception may be defined to assign a timing delay along any path. For example, with reference returning to FIG. 3B, instead of the exception disabling the path between terminal 84 and gate 88, as described above, the path may be allowed with an exception assigning a minimum time delay and a maximum time delay required from terminal 84 to terminal 86, wherein the time delay is determined by specific requirements of the block model.

Timing exceptions, such as the exemplary exceptions discussed hereinabove, can be applied on objects within the netlist for the block model. These objects may include reference clocks, cell terms, instances of cells, or any other type of design objects or instances, including block terms, block instances and net segments.

When using the Standard Block, single term path disable exceptions may also be defined and evaluated during creation of the Standard Block. However, when using a hierarchal netlist, all other exceptions are to be evaluated at the top level of the netlist for the Standard Block. In accordance with the principles of the present invention, all terms in a netlist involved in defining and assigning exceptions are to be made visible at the top level of the netlist. In a flat netlist, all such terms are already visible. In a hierarchal netlist, the marking of such terms is accomplished using the below described procedures. Once such terms are marked, they are visible at the top level of the netlist.

Referring now to FIG. 4, there is shown a flow chart 100 useful to describe an exemplary embodiment of a method of the present invention. As indicated at 102, the timing exceptions for the netlist have been defined, allowing the method of the flow chart 100 to commence. In the apparatus embodiments of the present invention, the timing exceptions may be entered by a user of the workstation 52 or automatically by the program code 64.

In accordance with the present invention, marking of selected ones of the nodes within the netlist, as indicated at 104, is first performed. When using a flat netlist, all such nodes are already visible at the top level. When using a hierarchal netlist, the marking also raises such nodes to be visible at the top level. After the selected nodes are marked, the step of generating a timing model, as indicated at 106, is performed. The next step, as indicated at 108, is creating exception signatures for the timing model. Finally, the method of flow chart 100 concludes with, as indicated at 110, removing extraneous ones of the exceptions signatures from the timing model. The timing model has a plurality of timing arcs with each of the timing arcs being between any respective two of the marked nodes. Exception signatures are created by converting the timing exceptions into exception signatures to be carried along with each one of the affected timing arcs.

Referring now to FIG. 5, there is shown a flow chart 112 useful to describe the step 104 (FIG. 4) of marking selected ones of the nodes. The flow chart 112 illustrates an exemplary preferred reiterative process which is performed for each object within the netlist to select the nodes to be marked in accordance with a set of rules described below. The description of the steps of the flowchart 112 sets forth an exemplary order in which such steps may be performed. It is to be understood that such steps may be performed in any order which satisfies the rules. Also, other processes may be used to satisfy the rules.

A desired result of the reiterative process of the flowchart 112 is that the marking of the nodes should occur preferably at those nodes that are at an input terminal of a leaf cell. However, it is not always possible that such marking of an input terminal of a leaf cell may be possible. Accordingly, the flow chart 112 also indicates the cases wherein a node at other than an input terminal to a leaf cell may also be marked.

The below described methods and examples of marking describe the preferred embodiment of using a hierarchal netlist. In one preferred embodiment of the present invention, a determination is made, as described below, whether the object in the netlist presently selected for the reiterative process of the flowchart 112 is at a lowest level. In another embodiment of the present invention, in which a flat netlist is used, this determination need not be made as it is not applicable to the flat netlist.

A first rule is that if the presently selected object is a node that is at the lowest level and also is at an input terminal of a standard cell then such node is marked. As indicated at determining step 114, a decision is made to determine whether the object in the netlist presently selected in the reiterative process of flowchart 112 is a node or an instance. If the selected object is a node, a path is taken to determining step 116. At the determining step 116, a decision is made to determine whether the node is at the lowest level in the netlist. If the present node is at the lowest level, a path is taken to determining step 118. At the determining step 118, a decision is made to determine whether such node is at an input to a standard cell. If so, a path is taken to marking step 120 to mark the present node.

Figure 6A:
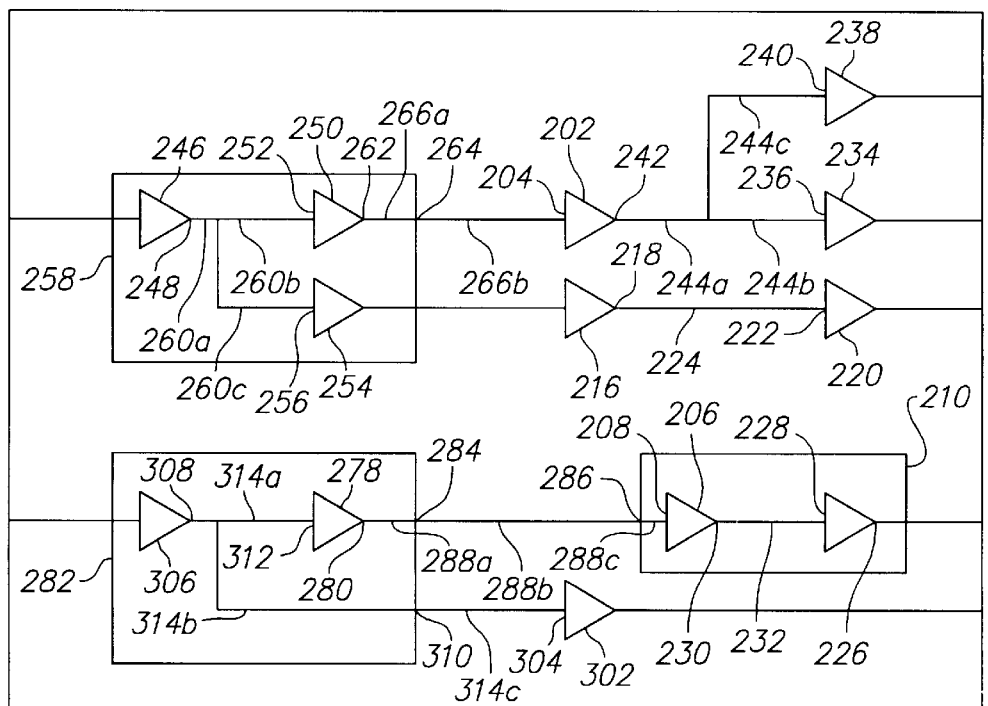
FIGS. 6A–N,P–Q are graphical representations of an exemplary netlist useful to describe examples of markings of nodes in conjunction with FIG. 5.

With further reference to FIG. 6A, there a shown a graphical representation of an exemplary netlist 200 useful to describe possible applications of the herein described set of rules in a netlist To describe two possible applications of the first rule, the netlist 200 includes a top level leaf cell 202 having an input terminal 204, and a lower level leaf cell 206 having an input terminal 208, the lower level leaf cell 206 being disposed within a module 210.

In one example of an application of the first rule, that presently selected object in the netlist 200 is the input terminal 204 of the leaf cell 202. The result of the decision made at the determining step 114 is that the presently selected object is a node. The result of the decision made at the determining step 116 is that this node is at the lowest level, since the position of this node is a leaf cell input terminal and, by definition, a leaf cell is always at a lowest level in the hierarchy irrespective of whether such leaf cell is already visible at the top level or contained within a black box module at any lower level. Accordingly, the result of the decision made at the determining step 118 is that this node is at an input of a standard cell. Finally, the input terminal 204 of the top level leaf cell 202 is marked in accordance with the marking step 120.

Similarly, in another example of the application of the first rule, the input terminal 208 of the leaf cell 206 would also be marked since the position of this node is also a leaf cell input terminal. Although the leaf cell 206 is disposed within the module 210 and is thus at a lower level, a leaf cell by definition is always at the lowest level.

Although not specifically applicable to the present examples, another consideration for marking the input terminal 204 of the leaf cell 202 and the input terminal 208 of the leaf cell 206 is that there are no more input terminals at either of these nodes. As described in other examples below, if there are more terminals at a node then each terminal need be considered. Furthermore, the above examples of FIG. 6A are not intended to be exhaustive of all possible nodes in the netlist 200 that may be marked in accordance with the process terminating at step 120 of FIG. 5.

A second rule is that if the presently selected object is an instance that is at the lowest level then the node at each input to the instance is marked. Accordingly, if the decision made at determining step 114 results in a determination that the presently selected object is an instance, a path is taken to determining step 122. At determining step 122 a decision is made to determine whether the instance is at the lowest level in the netlist, i.e., a leaf instance. If the instance is a leaf instance, a path is taken to marking step 124 to mark all inputs of the leaf instance.

Figure 6B:
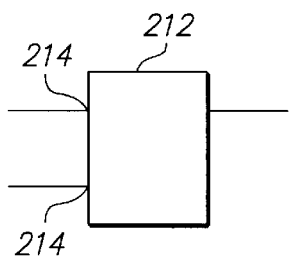

With reference to FIG. 6B, there is shown a leaf instance 212 having a plurality of input terminals 214. The leaf instance 212 may be an object of netlist 200 of FIG. 6A, and may be visible at the top level or be visible at any lower level if contained within any module.

In an example of an application of the second rule, the presently selected object in the netlist 200 is the leaf instance 212. The result of the determining step 114 is that this object is an instance. The result of the determining step 122 is that this instance is at the lowest level, since by definition and as described above, the leaf instance is always at the lowest level. Each node being an input terminal 214 of the leaf instance 212 is then marked in accordance with the marking step 124, thereby marking all input terminals 214 of the instance 212.

A third rule is that if the presently selected object is a node at the lowest level, such node not being an input terminal to a leaf cell and there being only one driver at such node, then all receiver input terminals at this node are marked. With reference again to FIG. 5, the decisions at the determining step 114 and the determining step 116 have already been made, similarly as described above in reference to the first rule, to reach the determining step 118, and need not be described again. In contrast to the description in reference to the first rule, if the result of the decision made at the determining step 118 determines that the presently selected node is not an input terminal to a leaf cell, a path is taken to determining step 126. At the determining step 126, a decision is made to determine whether such node has only one driver, i.e., an output of another instance. If the decision made at the determining step 126 determines that the presently selected node does have only one driver, a path is taken to marking step 128 to mark all receiver inputs coupled to this node.

Several applications of the third rule in the netlist 200, and modifications thereto, are described below. In each of the following examples, the decisions made at each of the determining step 114 and the determining step 116, as described above, have been made to determine that the presently selected object is a lowest level node, and the textual description of these decisions need not be repeated for each of the following examples.

One example of the application of the third rule is made with reference again to FIG. 6A. The exemplary netlist 200 may further include a top level leaf cell 216 having an output terminal 218 and a top level leaf cell 220 having an input terminal 222. The presently selected object in the reiterative process of the flowchart 112 is a lowest level node at the output terminal 218 of the leaf cell 216. The result of the decision made at the determining step 118 is that the presently selected node is not an input to a standard cell. The result of the decision made at the determining step 126 is that there is only one driver in the net at this node. The output terminal 218 of the leaf cell 216 is the only driver of the net, which includes a net segment 224, and the receiver input on the net segment 224 is the input terminal 222 of the leaf cell 220. Accordingly, the input terminal 222 is marked in accordance with the marking step 128.

In a similar example of an application of the third rule, wherein both cells are at a lower level, the netlist 200 may further include a lower level leaf cell 226 having an input terminal 228, the lower level leaf cell 226 being within the module 210. The lower level leaf cell 206 further has an output terminal 230. The presently selected object in the reiterative process of the flowchart 112 is a lowest level node at the output terminal 230 of the leaf cell 206. The result of the decision made at the determining step 118 is that the present node is not an input to a standard cell. The result of the decision made at the determining step 126 is that there is only one driver in the net at this node. The output terminal 230 of the leaf cell 206 is the only driver of the net, which includes a net segment 232, and the receiver input on the net segment 232 is the input terminal 228 of the leaf cell 226. Accordingly, the input terminal 228 is marked in accordance with the marking step 128.

In yet another example of an application of the third rule, wherein multiple top level input terminals exist at a top level output terminal node, the netlist 200 may further include a top level leaf cell 234 having an input terminal 236 and a top level leaf cell 238 having an input terminal 240. The top level leaf cell 202 further has an output terminal 242. The presently selected object in the reiterative process of the flowchart 112 is the output terminal 242 of the leaf cell 202. The result of the decision made at the determining step 118 is that the present node is not an input to a standard cell. The result of the decision made at the determining step 126 is that there is only one driver in the net at this node. The output terminal 242 of the leaf cell 202 is the only driver of the net, which includes net segments $244_{a-c}$. The multiple receivers are the receiver input on the net segment $244_b$, which is the input terminal 236 of the leaf cell 234, and the receiver input on the net segment $244_c$, which is the input terminal 240 of the leaf cell 238. Accordingly, the input terminal 236 and the input terminal 240 are both marked in accordance with the marking step 128.

In a similar example of an application of the third rule as described immediately above, with multiple input terminals being at an output terminal node but wherein all of the cells are at a lower level, the netlist 200 may further include a lower level leaf cell 246 having an output terminal 248, a lower level leaf cell 250 having an input terminal 252 and a lower level leaf cell 254 having an input terminal 256. Each of the leaf cells is at a lower level in the netlist 200 by being included within a module 258. The presently selected object in the reiterative process of the flowchart 112 is a lowest level node at the output terminal 248 of the leaf cell 246. The result of the decision made at the determining step 118 is that the present node is not an input to a standard cell. The result of the decision made at the determining step 126 is that there is only one driver in the net at this node. The output terminal 248 of the leaf cell 246 is the only driver of the net, which includes net segments $260_{a-c}$. The multiple receivers on this net are the receiver input on the net segment $260_b$, which is the input terminal 252 of the leaf cell 250, and the receiver input on the net segment $260_c$, which is the input terminal 256 of the leaf cell 254. Accordingly, the input terminal 252 and the input terminal 256 are both marked in accordance with the marking step 128.

A further example of the application of the third rule is described when a hierarchal boundary is crossed from a lower level leaf cell output terminal to a top level leaf cell input terminal. The lower level leaf cell 250 may further have an output terminal 262, and the module 258 has a hierarchal boundary output terminal 264. The presently selected object in the reiterative process of the flowchart 112 is a lowest level node at the output terminal 262 of the lower level leaf cell 250. The result of the decision made at the determining step 118 is that the present node is not an input to a standard cell. The result of the decision made at the determining step 126 is that there is only one driver in the net at this node. The output terminal 262 of the lower level leaf cell 250 is the only driver of the net, which includes net segments $266_{a-b}$. The next terminal encountered on the net, at the net segment $266_a$, is the hierarchal boundary output terminal 264 of the module 258. However, the output terminal 264 of the module 258 is not a leaf cell input terminal, and there is another terminal at the presently selected node to be considered. The next terminal encountered is a receiver input on the net segment $266_b$, which is the input terminal 204 of the top level leaf cell 202. Accordingly, the input terminal 204 is marked in accordance with the marking step 128.

Figure 6C:
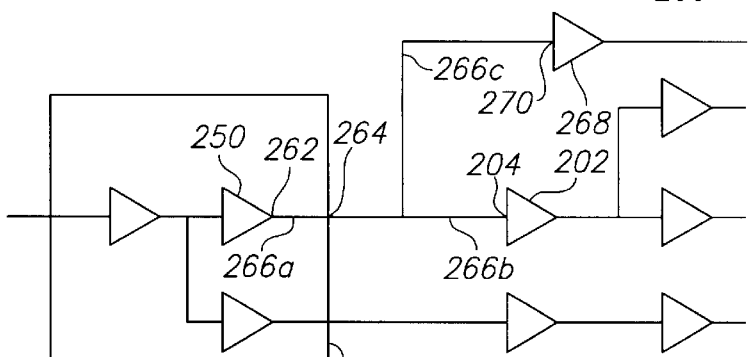

Yet a further example of the application of the third rule is described when a hierarchal boundary is crossed from a lower level leaf cell output terminal to multiple top level leaf cell input terminals. With reference to FIG. 6C, there is shown a modification to the netlist 200 to include a further top level leaf cell 268 having an input terminal 270. The presently selected object in the reiterative process of the flowchart 112 is a lowest level node at the output terminal 262 of the lower level leaf cell 250. The result of the decision made at the determining step 118 is that the present node is not an input to a standard cell. The result of the decision made at the determining step 126 is that there is only one driver in the net at this node. The output terminal 262 of the lower level leaf cell 250 is the only driver of the net, which includes net segments $266_{a-c}$. The next terminal encountered on the net, at the net segment $266_a$, is the hierarchal boundary output terminal 264 of the module 258. However, the output terminal 264 of the module 258 is not a leaf cell input terminal, and there are other terminals at the presently selected node to be considered. The next terminals encountered are multiple receiver inputs. One receiver input is on the net segment $266_b$, which is the input terminal 204 of the top level leaf cell 202, and the other receiver input is on the net segment $266_c$, which is the input terminal 270 of the top level leaf cell 268. Accordingly, the input terminal 204 and the input terminal 270 are both marked in accordance with the marking step 128.

Figure 6D:
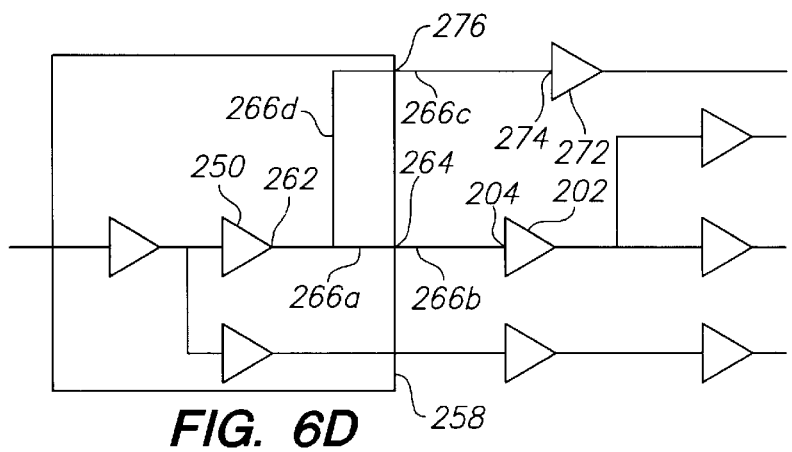

A related example of the application of the third rule is described when multiple hierarchal boundaries are crossed from a lower level leaf cell output terminal to a top level leaf cell input terminal at each boundary. With reference to FIG. 6D, there is shown a modification to the netlist 200 to include a further top level leaf cell 272 having an input terminal 274. The module 258 further has a hierarchal boundary output terminal 276. The presently selected object in the reiterative process of the flowchart 112 is a lowest level node at the output terminal 262 of the lower level leaf cell 250. The result of the decision made at the determining step 118 is that the present node is not an input to a standard cell. The result of the decision made at the determining step 126 is that there is only one driver in the net at this node. The output terminal 262 of the lower level leaf cell 250 is the only driver of the net, which includes net segments $266_{a-b,d-e}$. The next terminals encountered on the net are, at the net segment $266_a$, the hierarchal boundary output terminal 264 of the module 258 and, at the net segment $266_d$, the hierarchal boundary output terminal 276 of the module 258. However, the output terminal 264 and the output terminal 276 of the module 258 are not leaf cell input terminals, and there are other terminals at the presently selected node to be considered. The next terminal encountered from each of the output terminals 264, 276 is a receiver input. One receiver input is on the net segment $266_b$, which is the input terminal 204 of the top level leaf cell 202, and the other receiver input is on the net segment $266_e$, which is the input terminal 274 of the top level leaf cell 272. Accordingly, the input terminal 204 and the input terminal 274 are both marked in accordance with the marking step 128.

Figure 6E:
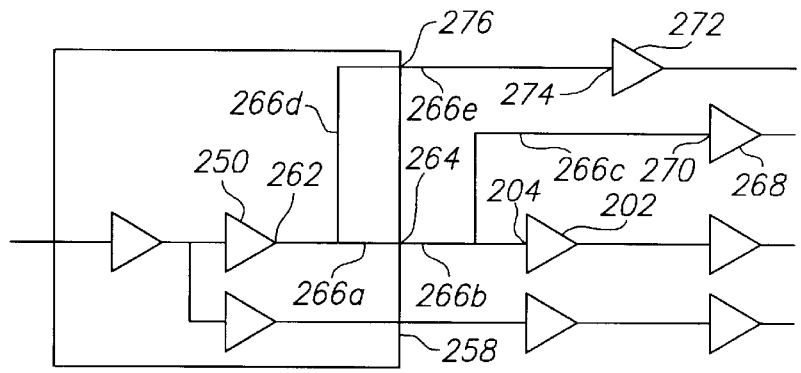

Another related example of the application of the third rule, which combines the two previous examples immediately set forth above, is next described. As best seen in FIG. 6E, the presently selected object in the reiterative process of the flowchart 112 is a lowest level node at the output terminal 262 of the lower level leaf cell 250. The result of the decision made at the determining step 118 is that the present node is not an input to a standard cell. The result of the decision made at the determining step 126 is that there is only one driver in the net at this node. The output terminal 262 of the lower level leaf cell 250 is the only driver of the net, which includes net segments $266_{a-e}$. The next terminals encountered on the net are, at the net segment $266_a$, the hierarchal boundary output terminal 264 and, at the net segment $266_d$, the hierarchal boundary output terminal 276 of the module 258. However, the output terminal 264 and the output terminal 276 of the module 258 are not a leaf cell input terminals, and there are other terminals at the presently selected node to be considered. From the output terminal 264, the next terminals encountered are multiple receiver inputs. One receiver input is on the net segment $266_b$, which is the input terminal 204 of the top level leaf cell 202, and the other receiver input is on the net segment $266_c$, which is the input terminal 270 of the top level leaf cell 268. From the output terminal 276, the next terminal encountered is a receiver input. This receiver input is on the net segment $266_e$, which is the input terminal 274 of the top level leaf cell 272. Accordingly, all of the input terminals 204, 270, 272 are marked in accordance with the marking step 128.

Another set of examples of an application of the third rule is when multiple hierarchal boundaries are crossed along a single path from an output of a lower level leaf cell to an input of a lower level leaf cell. With reference returning to FIG. 6A, the exemplary netlist 200 may further include a lower level leaf cell 278 having an output terminal 280 and a module 282 having a hierarchal boundary output terminal 284. The lower level leaf cell 278 is disposed within the module 282. The module 210 further has a hierarchal boundary input terminal 286. The presently selected object in the reiterative process of the flowchart 112 is a lowest level node at the output terminal 280 of the lower level leaf cell 278. The result of the decision made at the determining step 118 is that the present node is not an input to a standard cell. The result of the decision made at the determining step 126 is that there is only one driver in the net at this node. The output terminal 280 of the lower level leaf cell 278 is the only driver of the net, which includes net segments $288_{a-c}$. The next terminal encountered on the net is, at the net segment $288a$, the hierarchal boundary output terminal 284 of the module 282. However, the output terminal 284 is not a leaf cell input terminal, and there are other terminals at the presently selected node to be considered. From the output terminal 284, the next terminal encountered is the hierarchal boundary input terminal 286 of the module 210, at the net segment $288_b$. Similarly, the input terminal 286 is not a leaf cell input terminal and there are yet other terminals at the presently selected node to be considered. From the input terminal 286, the next terminal encountered is a receiver input, which is the leaf cell input terminal 208 of the lower level leaf cell 206, at the net segment $288_c$. Accordingly, the input terminal 208 is marked in accordance with the marking step 128.

Figure 6F:
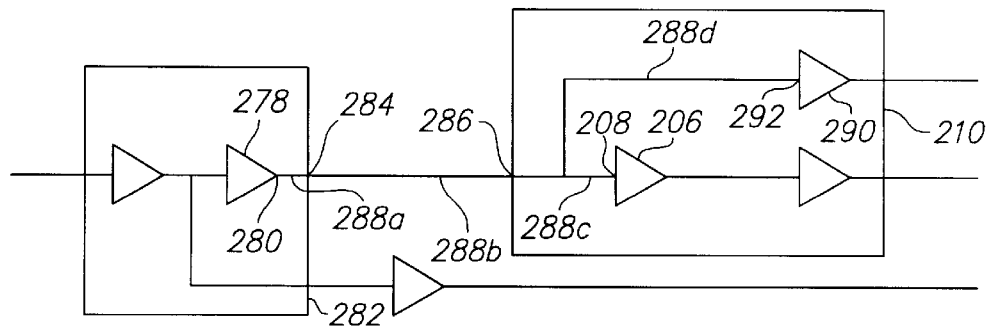

In a similar example of the application of the third rule, multiple hierarchal boundaries are crossed along the single path from a lower level leaf cell output terminal to multiple lower level leaf cell input terminals. With reference to FIG. 6F, the exemplary netlist 200 may further include a lower level leaf cell 290 having an input terminal 292, wherein the lower level leaf cell 290 is disposed within the module 210. The presently selected object in the reiterative process of the flowchart 112 is a lowest level node at the output terminal 280 of the lower level leaf cell 278. The result of the decision made at the determining step 118 is that the present node is not an input to a standard cell. The result of the decision made at the determining step 126 is that there is only one driver in the net at this node. The output terminal 280 of the lower level leaf cell 278 is the only driver of the net, which includes net segments $288_{a-d}$. The next terminal encountered on the net is, at the net segment $288_a$, the hierarchal boundary output terminal 284 of the module 282. However, the output terminal 284 is not a leaf cell input terminal, and there are other terminals at the presently selected node to be considered. From the output terminal 284, the next terminal encountered is the hierarchal boundary input terminal 286 of the module 210, at the net segment 288$_b$. Similarly, the input terminal 286 is not a leaf cell input terminal and there are yet other terminals at the presently selected node to be considered. From the input terminal 286, the next terminals encountered are multiple receiver inputs. One receiver input is the leaf cell input terminal 208 of the lower level leaf cell 206, at the net segment 288$_c$, and the other receiver input is the leaf cell input terminal 292 of the lower level leaf cell 290, at the net segment 288$_d$. Accordingly, the input terminal 208 and the input terminal 292 are both marked in accordance with the marking step 128.

Figure 6G:
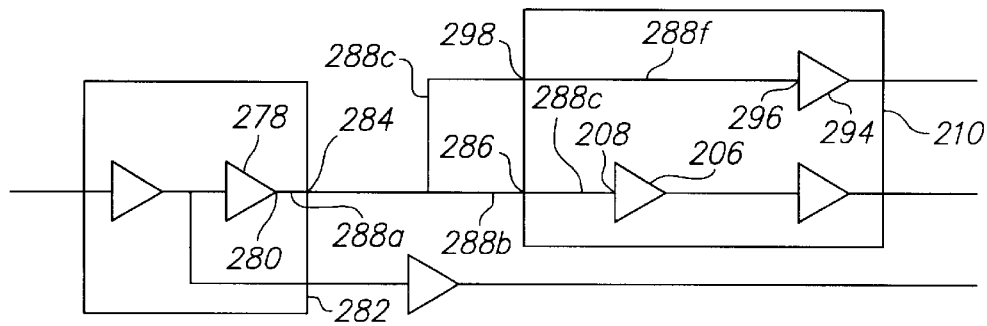

In a similar example of the application of the third rule, a hierarchal boundary is crossed along the single path from a lower level leaf cell output terminal that branches to multiple hierarchal boundaries to multiple lower level leaf cell input terminals. With reference to FIG. 6G, the exemplary netlist 200 may further include a lower level leaf cell 294 having an input terminal 296, wherein the lower level leaf cell 294 is disposed within the module 210, which further has hierarchal boundary input terminal 298. The presently selected object in the reiterative process of the flowchart 112 is a lowest level node at the output terminal 280 of the lower level leaf cell 278. The result of the decision made at the determining step 118 is that the present node is not an input to a standard cell. The result of the decision made at the determining step 126 is that there is only one driver in the net at this node. The output terminal 280 of the lower level leaf cell 278 is the only driver of the net, which includes net segments 288$_{a-c,e-f}$. The next terminal encountered on the net is, at the net segment 288$_a$, the hierarchal boundary output terminal 284 of the module 282. However, the output terminal 284 is not a leaf cell input terminal, and there are other terminals at the presently selected node to be considered. From the output terminal 284, the next terminals encountered are the hierarchal boundary input terminal 286, at the net segment 288$_b$, and the hierarchal boundary input terminal 298, at the net segment 288$_e$ of the module 210. Similarly, the input terminal 286 and the input terminal 298 are not a leaf cell input terminals and there are yet other terminals at the presently selected node to be considered. From the input terminal 286, the next terminal encountered is a receiver input, which is the leaf cell input terminal 208 of the lower level leaf cell 206, at the net segment 288$_c$. From the input terminal 298, the next terminal encountered is a receiver input, which is the leaf cell input terminal 296 of the lower level leaf cell 294, at the net segment 288$_f$. Accordingly, the input terminal 208 and the input terminal 296 are both marked in accordance with the marking step 128.

Figure 6H:
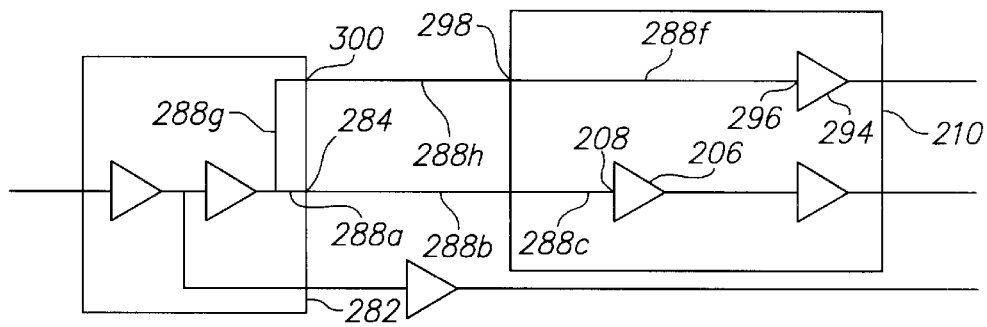

In another related example of the application of the third rule, multiple hierarchal boundaries are crossed along distinct paths from a lower level leaf cell output terminal to a single lower level leaf cell input terminal on each path. With reference to FIG. 6H, the module 282 further has hierarchal boundary output terminal 300. The presently selected object in the reiterative process of the flowchart 112 is a lowest level node at the output terminal 280 of the lower level leaf cell 278. The result of the decision made at the determining step 118 is that the present node is not an input to a standard cell. The result of the decision made at the determining step 126 is that there is only one driver in the net at this node. The output terminal 280 of the lower level leaf cell 278 is the only driver of the net, which includes net segments 288$_{a-c,f-h}$. The next terminals encountered on the net are, at the net segment 288$_a$, the hierarchal boundary output terminal 284, at the net segment 288$_a$, and the hierarchal boundary output terminal 300, at the net segment 288$_g$, of the module 282. However, the output terminal 284 an output terminal 300 and are not a leaf cell input terminals, and there are other terminals at the presently selected node to be considered. From the output terminal 284, the next terminal encountered is the hierarchal boundary input terminal 286, at the net segment 288$_b$, and from the output terminal 300, the next terminal encountered is the hierarchal boundary input terminal 298, at the net segment 288$_h$, each of the module 210. Similarly, the input terminal 286 and the input terminal 300 are not a leaf cell input terminals and there are yet other terminals at the presently selected node to be considered. From the input terminal 286, the next terminal encountered is a receiver input, which is the leaf cell input terminal 208 of the lower level leaf cell 206, at the net segment 288$_c$. From the input terminal 298, the next terminal encountered is a receiver input, which is the leaf cell input terminal 296 of the lower level leaf cell 294, at the net segment 288$_f$. Accordingly, the input terminal 208 and the input terminal 296 are both marked in accordance with the marking step 128.

Another type of example of an application of the third rule is wherein a hierarchal boundary is crossed from an output terminal of a lower level leaf cell to an input terminal of a top level leaf cell and also wherein no boundary is crossed to an input terminal of a lower level leaf cell. With reference returning to FIG. 6A, the exemplary netlist 200 may further include a top level leaf cell 302 having an input terminal 304 and, a lower level leaf cell 306 having an output terminal 308, which is disposed within the module 282. The module 282 further has a hierarchal boundary output terminal 310, and the lower level leaf cell 278 further has an input terminal 312. The presently selected object in the reiterative process of the flowchart 112 is a lowest level node at the output terminal 308 of the lower level leaf cell 306. The result of the decision made at the determining step 118 is that the present node is not an input to a standard cell. The result of the decision made at the determining step 126 is that there is only one driver in the net at this node. The output terminal 308 of the lower level leaf cell 306 is the only driver of the net, which includes net segments 314$_{a-c}$. The next terminals encountered on the net are, at the net segment 314$_a$, the input terminal 312 of the lower level leaf cell 278 and, at the net segment 314$_b$, hierarchal boundary output terminal 310. Although a leaf cell input terminal, which is the input terminal 312 has been reached, the output terminal 310 is not a leaf cell input terminal, and there are other terminals at the presently selected node to be considered. From the output terminal 310, the next terminal encountered is a receiver input, which is the leaf cell input terminal 304 of the top level leaf cell 302, at the net segment 314$_c$. Accordingly, the input terminal 304 and the input terminal 312 are both marked in accordance with the marking step 128.

Figure 6I:
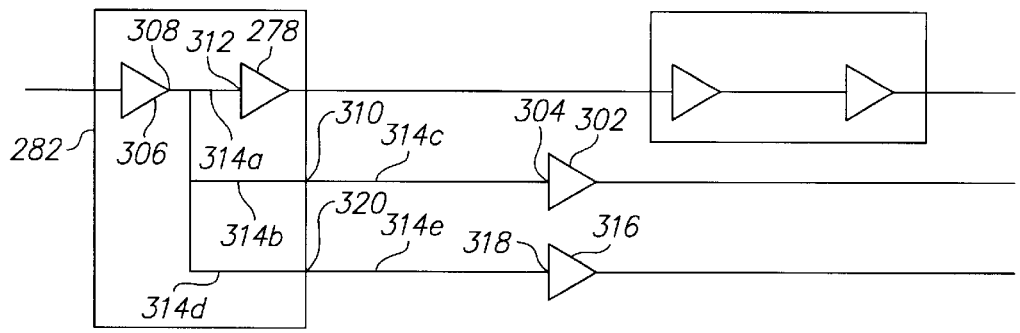

A related example of an application of the third rule is wherein multiple hierarchal boundaries are crossed along separate paths from an output terminal of a lower level leaf cell to an input terminal of a top level leaf cell on each path and also wherein no boundary is crossed to an input terminal of a lower level leaf cell. With reference to FIG. 6I, the exemplary netlist 200 may further include a top level leaf cell 316 having an input terminal 318. The module 282 further has a hierarchal boundary output terminal 320. The presently selected object in the reiterative process of the flowchart 112 is a lowest level node at the output terminal 308 of the lower level leaf cell 306. The result of the decision made at the determining step 118 is that the present node is not an input to a standard cell. The result of the decision made at the determining step 126 is that there is only one driver in the net at this node. The output terminal 308 of the lower level leaf cell 306 is the only driver of the net, which includes net segments $314_{a-e}$. The next terminals encountered on the net are the input terminal 312 of the lower level leaf cell 278 at the net segment $314_a$, the hierarchal boundary output terminal 310 at the net segment $314_b$, and the hierarchal boundary output terminal 320 at the net segment $314_d$, Although a leaf cell input terminal, which is the input terminal 312, has been reached, the output terminal 310 and the output terminal 320 are not a leaf cell input terminals, and there are other terminals at the presently selected node to be considered. From the output terminal 310 the next terminal encountered is a receiver input, which is the leaf cell input terminal 304 of the top level leaf cell 302 at the net segment $314_c$, and from the output terminal 320 the next terminal encountered is the receiver input, which is the leaf cell input terminal 318 of the top level leaf cell 316 at the net segment $314_e$. Accordingly, the input terminal 304, the input terminal 312 and the input terminal 318 are all marked in accordance with the marking step 128.

Figure 6J:
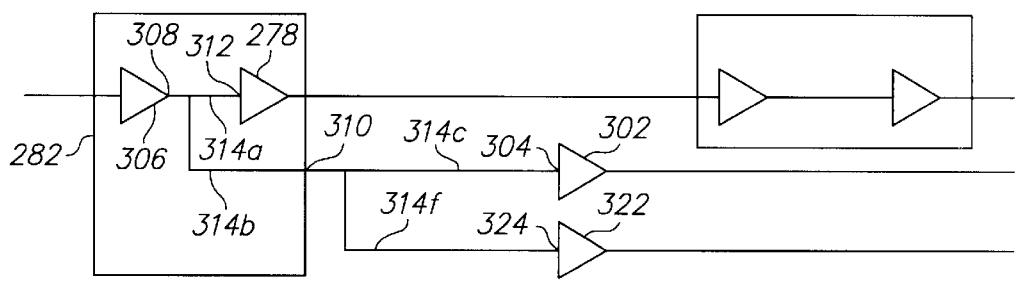

A related example of an application of the third rule is wherein a hierarchal boundary is crossed from an output terminal of a lower level leaf cell to multiple input terminals of top level leaf cells and also wherein no boundary is crossed to an input terminal of a lower level leaf cell. With reference to FIG. 6J, the exemplary netlist 200 may further include a top level leaf cell 322 having an input terminal 324. The presently selected object in the reiterative process of the flowchart 112 is a lowest level node at the output terminal 308 of the lower level leaf cell 306. The result of the decision made at the determining step 118 is that the present node is not an input to a standard cell. The result of the decision made at the determining step 126 is that there is only one driver in the net at this node. The output terminal 308 of the lower level leaf cell 306 is the only driver of the net, which includes net segments $314_{a-c,f}$. The next terminals encountered on the net are the input terminal 312 of the lower level leaf cell 278, at the net segment $314_a$, and the hierarchal boundary output terminal 310 at the net segment $314_b$. Although a leaf cell input terminal, which is the input terminal 312 has been reached, the output terminal 310 is not a leaf cell input terminal, and there are other terminals at the presently selected node to be considered. From the output terminal 310 the next terminal encountered are multiple receiver inputs. One receiver input is the leaf cell input terminal 304 of the top level leaf cell 302 at the net segment $314_c$, and the other receiver input is the leaf cell input terminal 324 of the top level leaf cell 322 at the net segment $314_f$. Accordingly, the input terminal 304, the input terminal 312 and the input terminal 324 are all marked in accordance with the marking step 128.

Figure 6K:
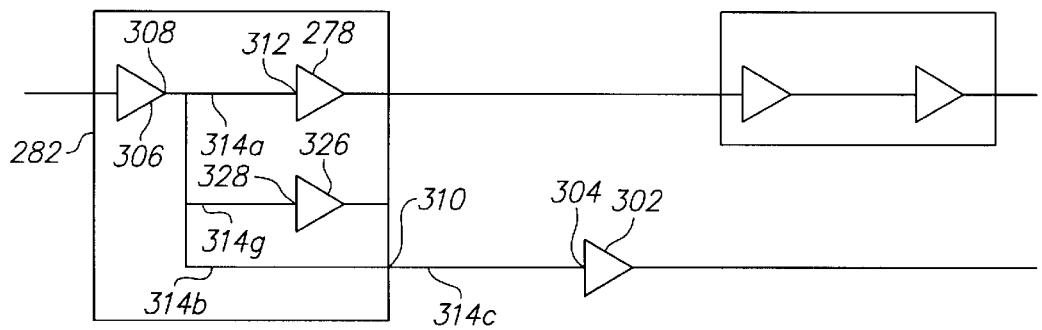

A related example of an application of the third rule is wherein multiple hierarchal boundaries are crossed along separate paths from an output terminal of a lower level leaf cell to an input terminal of a top level leaf cell on each path and also wherein no boundary is crossed to an input terminal of a lower level leaf cell. With reference to FIG. 6K, the exemplary netlist 200 may further include a lower level leaf cell 326 having an input terminal 328. The presently selected object in the reiterative process of the flowchart 112 is a lowest level node at the output terminal 308 of the lower level leaf cell 306. The result of the decision made at the determining step 118 is that the present node is not an input to a standard cell. The result of the decision made at the determining step 126 is that there is only one driver in the net at this node. The output terminal 308 of the lower level leaf cell 306 is the only driver of the net, which includes net segments $314_{a-c,g}$. The next terminals encountered on the net are the input terminal 312 of the lower level leaf cell 278 at the net segment $314_a$, the hierarchal boundary output terminal 310 at the net segment $314_b$, the hierarchal boundary output terminal 320 at the net segment $314_d$, and the input terminal 328 of the lower level leaf cell 326. Although leaf cell input terminals, which are the input terminal 312 and the input terminal 328 have been reached, the output terminal 310 is not a leaf cell input terminal, and there are other terminals at the presently selected node to be considered. From the output terminal 310 the next terminal encountered is a receiver input, which is the leaf cell input terminal 304 of the top level leaf cell 302 at the net segment $314_c$. Accordingly, the input terminal 304, the input terminal 312 and the input terminal 328 are all marked in accordance with the marking step 128.

Figure 6L:
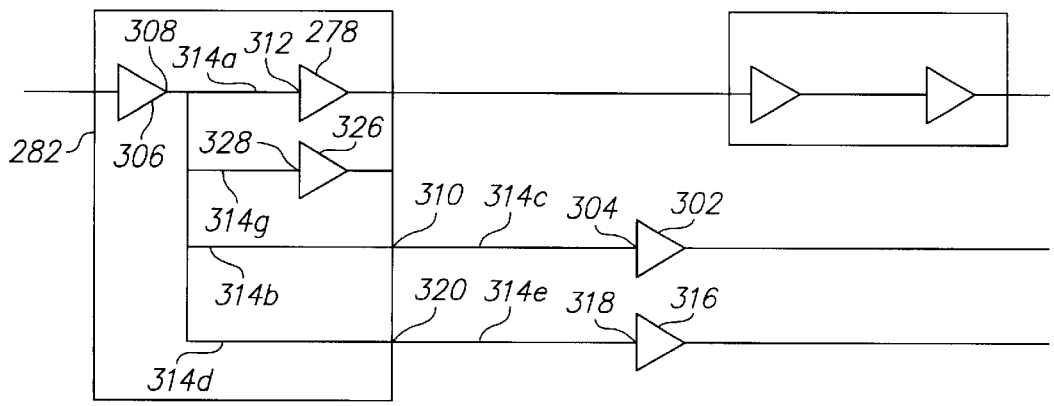

An example combining the principles of FIG. 6I and FIG. 6K is wherein multiple hierarchal boundaries are crossed along separate paths from an output terminal of a lower level leaf cell to an input terminal of a top level leaf cell on each path and also wherein no boundary is crossed to each input terminal of multiple lower level leaf cells. As best seen in FIG. 6L, the presently selected object in the reiterative process of the flowchart 112 is a lowest level node at the output terminal 308 of the lower level leaf cell 306. The result of the decision made at the determining step 118 is that the present node is not an input to a standard cell. The result of the decision made at the determining step 126 is that there is only one driver in the net at this node. The output terminal 308 of the lower level leaf cell 306 is the only driver of the net, which includes net segments $314_{a-e,g}$. The next terminals encountered on the net are the input terminal 312 of the lower level leaf cell 278 at the net segment $314_a$, the hierarchal boundary output terminal 310 at the net segment $314_b$, the hierarchal boundary output terminal 320 at the net segment $314_d$, and the input terminal 328 of the lower level leaf cell 326. Although leaf cell input terminals, which are the input terminal 312 and the input terminal 328 have been reached, the output terminal 310 and the output terminal 320 are not a leaf cell input terminals, and there are other terminals at the presently selected node to be considered. From the output terminal 310 the next terminal encountered is a receiver input, which is the leaf cell input terminal 304 of the top level leaf cell 302 at the net segment $314_c$, and from the output terminal 320 the next terminal encountered is the receiver input, which is the leaf cell input terminal 318 of the top level leaf cell 316 at the net segment $314_e$. Accordingly, the input terminal 304, the input terminal 312, the input terminal 318 and the input terminal 328 are all marked in accordance with the marking step 128.

Figure 6M:
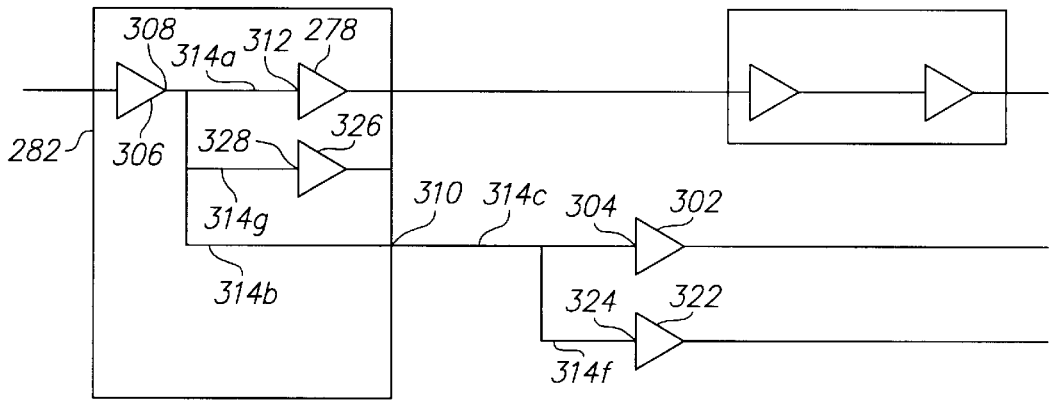

A final example of an application of the third rule, combining the principles of FIG. 6J and FIG. 6K is wherein a hierarchal boundary is crossed from an output terminal of a lower level leaf cell to multiple input terminals of top level leaf cells and also wherein no boundary is crossed to an input terminal of a lower level leaf cell. As best seen in FIG. 6M, the presently selected object in the reiterative process of the flowchart 112 is a lowest level node at the output terminal 308 of the lower level leaf cell 306. The result of the decision made at the determining step 118 is that the present node is not an input to a standard cell. The result of the decision made at the determining Step 126 is that there is only one driver in the net at this node. The output terminal 308 of the lower level leaf cell 306 is the only driver of the net, which includes net segments $314_{a-c,g}$. The next terminals encountered on the net are the input terminal 312 of the lower level leaf cell 278 at the net segment 314$_a$. the hierarchal boundary output terminal 310 at the net segment 314$_b$, and the input terminal 328 of the lower level leaf cell 326 at the net segment 314$_g$. Although leaf cell input terminals, which are the input terminal 312 and the input terminal 328 have been reached, the output terminal 310 is not a leaf cell input terminal, and there are other terminals at the presently selected node to be considered. From the output terminals 310 the next terminals encountered are multiple receiver inputs. One receiver input is the leaf cell input terminal 304 of the top level leaf cell 302 at the net segment 314$_c$, and the other receiver input is the leaf cell input terminal 324 of the top level leaf cell 322 at the net segment 314$_f$. Accordingly, the input terminal 304, the input terminal 312, the input terminal 324 and the input terminal 328 are all marked in accordance with the marking step 128.

A fourth rule is that if the presently selected object is a node at the lowest level such node being an output terminal of a multiple output cell and there being more than one driver at such node, then such cell output terminal is marked. with reference again to FIG. 5, the decisions at the determining step 114, the determining step 116, and determining step 118 have already been made, similarly as described above and reference to the third rule, to reach the determining step 126, and need not be described again. In contrast to the description in reference to the third rule, if the result of the decision made at the determining step 126 determines that the presently selected node has more than one driver, a path is taken to determining step 130. At the determining step 130, a decision is made to determine whether the cell at the presently selected node (being a cell output) has a single output. If the decision made at the determining step 130 determined that such cell has multiple outputs, a path is taken to marking step 132 to mark the cell output at the presently selected node.

Figure 6P:
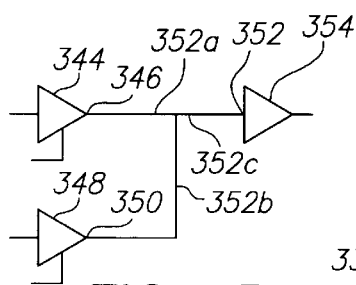
Figure 6N:
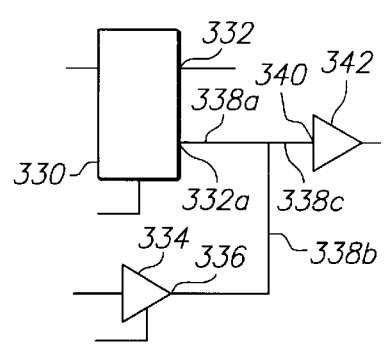

An example of an application of the fourth rule is made with reference to FIG. 6N. The exemplary netlist 200 (FIG. 6A) may further include a cell 330 having a plurality of output terminals 332, and a cell 334 having an output terminal 336. The presently selected object in the reiterative process of the flowchart 112 is a lowest level node at the output terminal 332$_a$ of the cell 330. Upon reaching the determining step 126, as described above, the result of the decision made at the determining step 126 is that the net has more than one driver. The output terminal 332$_a$ of the cell 330 drives a net segment 338$_a$, and the output terminal 336 of the cell 334 drives a net segment 338$_b$, each of the net segments come together at a net segment 338$_c$ to drive an input terminal 340 of a further object 342. The result of the decision made at the determining step 130 is that the cell 330 as multiple outputs 332. Accordingly, the output terminal 332$_a$, being the presently selected object, is marked in accordance with the marking step 132.

A fifth rule is that if the presently selected object is a node at the lowest level, such node being an output terminal of a single output sequential cell and there being more than one driver at such node, then such cell output terminal is marked. With reference again to FIG. 5, the decisions at the determining step 114, the determining step 116, the determining step 118, and the determining step 126 have already been made, similarly as described above and reference to the third rule, to reach the determining step 130, and need not be described again. In contrast to the description in reference to the fourth rule, if the result of the decision made at the determining step 130 determines that the cell at the presently selected node, which is an output terminal of such cell, has only this single output terminal, a path is taken to determining step 134. At the determining step 134, a decision is made to determine whether the cell at the presently selected node is sequential. If the decision made at the determining step 134 determined that such cell is sequential, a path is taken to the marking step 132 to mark the cell output at the presently selected node.

An example of an application of the fifth rule is made with reference to FIG. 6P. The exemplary netlist 200 (FIG. 6A) may further include a sequential cell 344 having an output terminal 346, and an object 348 having an output terminal 350. The presently selected object in the reiterative process of the flowchart 112 is a lowest level node at the output terminal 346 of the cell 344. Upon reaching the determining step 126, as described above, the result of the decision made at the determining step 126 is that the net has more than one driver. The output terminal 344 of the cell 330 drives a net segment 352$_a$, and the output terminal 350 of the cell 348 drives a net segment 352$_b$, each of the net segments come together at a net segment 352$_c$ to drive an input terminal 352 of a further object 354. The result of the decision made at the determining step 130 is that the cell 344 has only the single output terminal 346. Accordingly, the output terminal 346, being the presently selected object, is marked in accordance with the marking step 132.

A sixth rule is that if the presently selected object is a node at the lowest level, such node being an output terminal of a multiple output non-sequential cell and there being more than one driver at such node, then each input terminal of such cell is marked. With reference again to FIG. 5, the decisions at the determining step 114, the determining step 116, the determining step 118, the determining step 126 and determining step 130 have already been made, similarly as described above and reference to the fifth rule, to reach the determining step 134, and need not be described again. In contrast to the description in reference to the fifth rule, if the result of the decision made at the determining step 134 determines that the cell at the presently selected node is non-sequential, a path is taken to marking step 136 to mark each respective node at all inputs of the cell having a single output terminal at the presently selected node.

Figure 6Q:
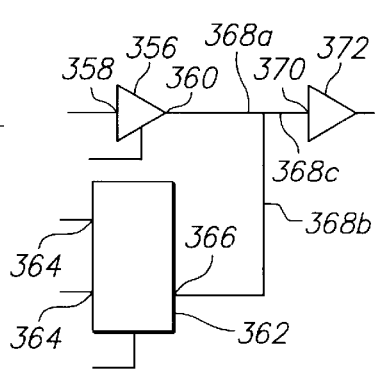

Examples of an application of the sixth rule is made with reference to FIG. 6Q. The exemplary netlist 200 (FIG. 6A) may further include a non-sequential cell 356 having an input terminal 358 and an output terminal 360, and non-sequential cell 362 having a plurality of input terminals 364 and an output terminal 366.

In one such example, the presently selected object in the reiterative process of the flowchart 112 is a lowest level node at the output terminal 360 of the non-sequential cell 356. Upon reaching the determining step 126, as described above, the result of the decision made at the determining step 126 is that the net has more than one driver. The output terminal 360 of the cell 330 drives a net segment 368$_a$, and the output terminal 366 of the cell 362 drives a net segment 368$_b$, each of the net segments coming together at a net segment 368$_c$ to drive an input terminal 370 of a further object 372. The result of the decision made at the determining step 130 is that the cell 356 has only the single output terminal 360. The result of the decision made at the determining step 134 is that the cell 356 is non-sequential. Accordingly, the input terminal 358 of the non-sequential cell 356 is marked in accordance with the marking step 136.

Similarly, with respect to the cell 362, the presently selected object is its output terminal 366. The result that the decision made at the determining step 126 is that the output terminal 366 is at a net with more than one driver, as described immediately above. The result of the decision made at determining step 130 is that the cell 362 has only a single output, which is the output terminal 366. The result of the decision made at the determining step 134 is that the cell 362 is non-sequential. Accordingly, all input terminals 364 of the non-sequential cell 362 are marked in accordance with the marking step 136.

With reference returning to FIG. 5, should the decision made at the determining step 116 result in the decision that the present object, being a node, is not at the lowest level, a path is taken to a turning step 138 to indicate a reiterative process occurs that turns such high level node into a list of cell level nodes. For each cell level node identified in the list at the turning step 138, the decision at the determining step 118 is then made, with the above described resulting steps being taken in accordance with the decision made at the determining step 118.

Similarly, should the decision made at the determining step 122 results in the decision of the present object, being an instance, is not at the lowest level, a path is taken to an identifying step 140 to indicate a reiterative process occurs that each node at such instance is identified, such nodes by definition also not being at the lowest level. For each such node identified at the identifying step 140, a path is then taken to turning step 138 wherein each identified node is converted into a list of cell level nodes, as described immediately above.

The process described above in reference to FIG. 5 may, in one exemplary embodiment to the present invention, also be a procedure performed by the program code 24 (FIG. 2). Furthermore, the above described examples for the application of the rules of the flowchart of FIG. 5 are not intended to be exhaustive of all such examples that may occur in applying the above defined rules to any netlist.

The step 106 of generating the timing model (FIG. 4) may further include defining timing arcs between the nodes selectively marked as hereinabove described in reference to FIG. 5. Generally, a timing model for a netlist is concerned only with the timing relationship between the input and output ports in a block model generated from the netlist. However, the marking of nodes, as described above, allows timing arcs to be defined between other nodes within the netlist, irrespective of whether a flat or hierarchal netlist is used. Furthermore, when using a hierarchal netlist, the marking of nodes allows the marked nodes to be visible at the top level of the netlist, thereby creating internal nodes within the model.

Figure 7:
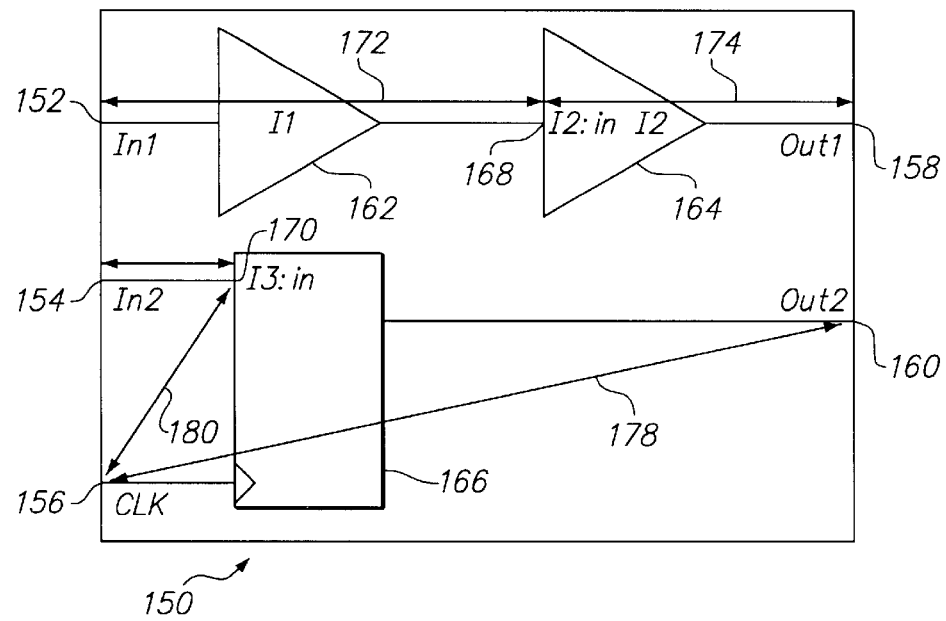
FIG. 7 is a graphical representation of a netlist useful to describe the step of generating a timing model of FIG. 4.

With reference to FIG. 7, the step of generating the timing model and defining timing arcs between the internal nodes is described. As best seen in FIG. 7, a module 150 within a netlist may exemplarily include a first input (In1) port 152, a second input (In2) port 154, a clock (CLK) input 156, a first output (Out1) port 158 and a second output (Out2) port 160.

Whereas a conventional timing model may only be concerned with the timing relationships between these inputs and outputs, the internal nodes in the module may be created as above described. For example, the module 150 may include a first instance (I1) 162, a second instance (I2) 164 and a third instance (I3) 166. If the second instance 154 is a leaf cell, one such internal node created may be an input (I2:in) terminal 168. If the third instance 166 is a non-sequential cell, another such internal node may be an input (I3:in) terminal 170.

With the internal nodes created, the timing arcs may now be defined. Set forth below are several examples of possible timing arcs.

One example of a timing arcs that may be defined within the netlist are delay arcs through instances along a signal path. For example, a signal path between In1 and Out1 may have a first delay arc from In1 to I2:in through a first instance I1 and a second delay arc from I2:in to Out1 through a second instance I2. This example, as best seen in FIG. 7, the signal path between the first input port 152 and the first output port 158 may include a first delay arc 172 between the first input port 152 and the input terminal 168 of the leaf cell 164 through the instance 162, and a second delay arc 174 between this input terminal 168 and the first output port 158 through the leaf cell 164.

Another example of timing arcs that may be defined within the netlist are zero delay arcs wherein a signal path does not include any instance. For example, a signal path between In2 and I3:in may have a zero delay arc, since this signal path is along a net segment that does not include any intervening instance. This example, as best seen in FIG. 7, the signal path between the second input port 154 and the input terminal 170 of the non-sequential cell 166 may include a zero delay arc 176.

A further example of timing arcs that may be defined within the netlist are delay arcs wherein the signal paths is between a clock input of a module and an output of the module. For example, a signal path between Clk and Out2 may also have a delay are assigned thereto. This example, as best seen in FIG. 7, the signal path between the clock input port 156 and the second output port 160 may include a delay arc 178.

Yet another example of timing arcs that may be defined within the netlist are set up arcs wherein the signal path is between a clock input of an instance and a data input of the instance. For example, the signal path between Clk and I3:in may have a setup arc assigned thereto. This example, as best seen in FIG. 7, signal path between the clock input port 156 and the input terminal 170 of the non-sequential cell 166 may include a setup arc 180.

The foregoing examples of timing arcs are not intended to be exhaustive of all such timing arcs that may be defined in a netlist, but are only set forth as specific exemplary timing arcs. The timing arcs defined in accordance with the step 106 of generating the timing model may, in another exemplary embodiment of the present invention, also be generated as a procedure by the program code 24 (FIG. 2).

The step 108 of creating the exception signatures (FIG. 3) includes converting the timing exceptions into exception signatures that are to be carried along the timing arcs. As described above with reference to FIG. 7, internal nodes are created in the net list. In a preferred embodiment of the present invention, when using a hierarchal netlist, the internal nodes are visible at the top level of the netlist. The timing exceptions are converted into exception signatures. Each of the exception signatures is then carried along node to node along the affected timing arcs.

Figure 8:
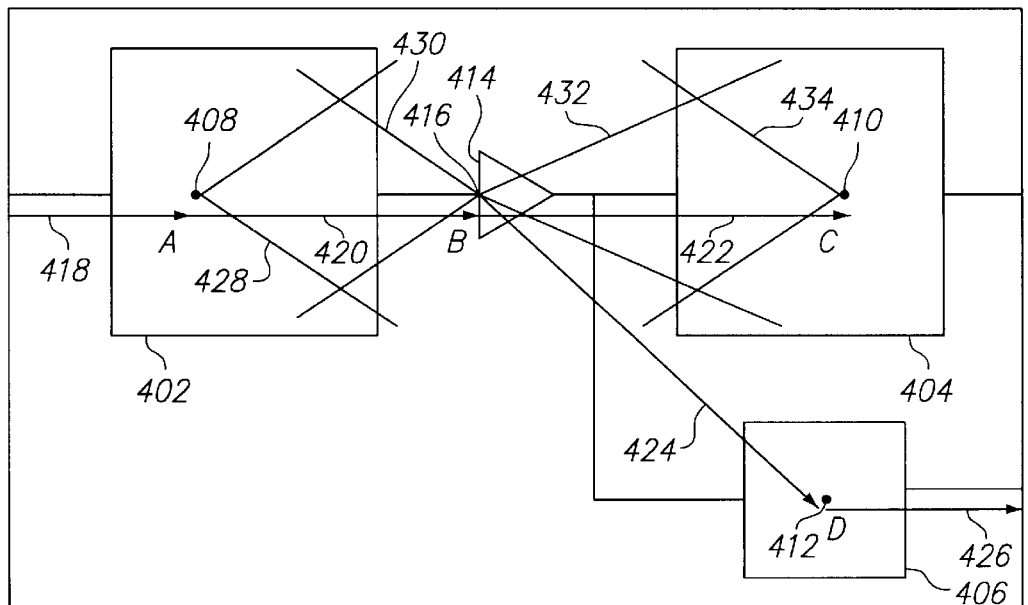
FIG. 8 is graphical representations of a netlist useful to describe, respectively, the steps of creating exception signatures and eliminating extraneous data of FIG. 4.

As best seen in FIG. 8, there is shown a top level representation of a netlist 400 which may include a first module 402, a second module 404, and a third module 406. The first module 402 has an internal node 408, the second module 404 has an internal node 410 and the third module 406 has an internal node 412, wherein each of the internal nodes 408, 410, 412 are selected nodes having been raised to the top level as hereinabove described. The netlist 400 may also have a standard cell 414 interposed the first module 402 and the second module 404. The cell 414 may further have an input terminal 416, which is yet another node visible at the top level as hereinabove described.

One example of timing exception for the netlist 400 is to disable a path from the internal node 408 through the input terminal 414 to the internal node 410, which may be identified, respectively, as fake terms in the netlist A, B and C, as best seen in FIG. 8. The timing exception may then be written has "disable from A through B to C." Assigning the fake term D to the node 412, a path from A through B to D is allowed.

The exception signature is created by converting the above timing exception "disable from A through B to C" into two exception signatures. The first exception signature, Signature 1, and the second exception signature, Signature 2, may be written as set forth as follows:

| Signature 1 | Signature 2 |
|---|---|
| From: A | From: B |
| To: B | To: C |
| Next: B -> C | Next: Null |

In the timing model generated for the netlist 400, in accordance with step 106 (FIG. 4), a first timing arc 418 may originate from a node (not shown) and terminate at A. A second timing arc 420 may then originate from A and terminate at B. A third timing arc 422 may then originate from B and terminate at C, and a fourth timing arc 424 may also originate from B and terminate at D. In accordance with the allowed timing, a fifth timing arc 426 may originate from D and terminate at another node (not shown).

The first exception signature, Signature 1, is carried along the second timing arc 420 in the timing model, since the first exception signature originates from A. Upon reaching B, the first exception signature specifies that the next exception signature disables a path from B to C. The second exception signature, Signature 2, would normally be carried along each of the third timing arc 422 and the fourth timing arc 424, since this exception signature originates from B. Upon reaching C, the second exception signature specifies that there is no further valid path from C. Upon reaching D, the path continues along the fourth timing arc 426 without any exception signature being carried forward since this is a valid path.

The step 110 of removing extraneous data (FIG. 4) includes defining signature logic cones associated with a particular timing exception and the timing arcs along the timing path to which the timing exception is associated whereby exception signatures for this timing exception being carried along a timing arc external to an intersection of signature logic cones to which the exception signature is associated are removed from the data of the timing model. There are two types of signature logic cones. A first type of signature logic cone radiates outwardly from a term to include all possible signal paths originating from such term. A second type of signature logic cone radiates inwardly to a term to include all possible signal paths terminating at such term.

For either type of signature logic cone, after a timing exception is converted into its associated exception signatures, logic cones for this timing exception are drawn radiating from and to each node along the path of the timing exception. If an exception signature is carried along a timing arc contained within the intersection of the first type and second type of logic cones, then this exception signature is necessary to the data of the timing model. However, if an exception signature is carried along a timing arc not contained within the intersection of the first and second type of logic cones, then this exception signature is extraneous to the data of the timing model and may accordingly be removed therefrom.

Accordingly, with reference again to FIG. 8, for the above defined timing exception "disable from A through B to C," a first signature logic cone 428 may be drawn as originating from the term A, being the node 408, and a second signature logic cone 430 may be drawn as terminating at the term B, being the input terminal node 414. Similarly, a third logic cone 432 may be drawn as originating from the term B, and a fourth logic cone 434 may be drawn as terminating at the term C, being the note 410. It can be appreciated that the for above defined timing exception, which includes only the terms A, B and C, the first through fourth logic cones 428, 430, 432 and 434 are the logic cones associated with this timing exception.

As described above, the first exception signature, Signature 1, is carried along the second timing arc 420 that originates at term A and terminates at term B. Clearly, the first exception signature is contained within the intersection of the first signature logic cone 428 and the second signature logic cone 430 and is, accordingly, necessary data to be maintained within the timing model.

Similarly, the second exception signature, Signature 2, is carried along each of the third timing arc 422 that originates at term B and terminates at term C, and the fourth timing arc 424 that originates at term B and terminates at term D. Clearly, the second exception signature carried along the third timing arc 422 is contained within the intersection of the third signature logic cone 432 and the fourth signature logic cone 434 and is, accordingly, necessary data to be maintained within the timing model. However, the second exception signature carried along the fourth timing arc 424 is not contained within the intersection of any logic cones and is, accordingly, extraneous data that may be removed from the timing model.

Regarding exception signatures, multi-cycle signatures are carried forward until a flop is reached. Path delay exceptions create a new departure time at the ending term. Single term path disable exceptions may be handled at the Standard Block level. The ignore path between clock domains is done at the time of calculating slack. Departure times ride backward on arrival streams which have exception signatures. At endpoints, e.g., FF in, I/O, departure time is converted to a rival time. There is no need to deal with propagating exceptions backwards.

The foregoing examples of timing exceptions and signature logic cones are not intended to be exhaustive of all such timing exceptions and signature logic cones that may be defined in a netlist or timing models, but are only set forth as specific exemplary timing exceptions and signature logic cones. Accordingly, the methods of the present invention are not to be limited to the specific examples. The signature logic cones defined in accordance with the step 110 of removing extraneous exception signatures may, in another exemplary embodiment of the present invention, also be generated as a procedure by the program code 24 (FIG. 2).

There has been described hereinabove exemplary preferred embodiment of metal apparatus and methods for the hierarchal handling of timing exceptions in a netlist. Those skilled in the art may not make numerous uses of, and departures from, the exemplary preferred embodiment described hereinabove without departing from the inventive principles disclosed herein. Accordingly, the present invention is to be defined solely by the broadest permissible scope of the following Claims.

What is claimed as the invention is:

1. A method for hierarchal handling of timing exceptions within a netlist comprising:
   marking selected ones of a plurality of nodes in said netlist;
   generating a timing model having a plurality of timing arcs wherein each of said timing arcs are between any two respective ones of said selected ones of said nodes;
   creating exception signatures for said timing exceptions to be carried along each of said timing arcs; and
   removing extraneous ones of said exception signatures from said timing arcs.

2. A method as set forth in claim 1 wherein said netlist is hierarchal and includes a plurality of instances and standard cells, said marking said selected ones of said nodes includes:
   for each of said nodes, marking a present one of said nodes wherein said present one of said nodes is at a lowest level of said hierarchy and at an input to any one of said instances.

3. A method as set forth in claim 2 wherein said marking said selected ones of said nodes further includes:
   determining that said input to said any one of said instances is an input to a standard cell prior to marking said present one of said nodes.

4. A method as set forth in claim 2 wherein said marking said selected ones of said nodes further includes:
   determining that said present one of said nodes is at said lowest level prior to marking said present one of said nodes.

5. A method as set forth in claim 4 wherein said marking said selected ones of said nodes further includes:
   determining that said input to said any one of said instances is an input to a standard cell subsequent to said determining that said present one of said nodes is at said lowest level.

6. A method as set forth in claim 4 wherein said marking selected ones of said nodes further includes:
   for each of said objects, determining that a present one of said objects is said present one of said nodes prior to determining that said present one of said nodes is at said lowest level.

7. A method as set forth in claim 1 wherein said marking selected ones of said nodes includes:
   for each of said instances, determining that a present one of said instances is at a lowest level of said hierarchy; and, if so,
   marking all inputs to said present one of said instances.

8. A method as set forth in claim 7 wherein said marking selected ones of said nodes further includes:
   for each of said objects, determining that a present one of said objects is said present one of said instances prior to determining that said present one of said instances is at said lowest level.

9. A method as set forth in claim 1 wherein said marking said selected ones of said nodes includes:
   for each of said nodes, determining that a present one of said nodes is not at a lowest level in said hierarchy;
   for each of said nodes not at said lowest level, converting said present one of said nodes into a list of cell level nodes; and
   for each of said cell level nodes, determining that a present one of each of said cell level nodes is an input to a standard cell prior to marking said present one of said cell level nodes.

10. A method as set forth in claim 9 wherein said marking said selected ones of said nodes further includes:
    for each of said objects, determining that a present one of said objects is said present one of said nodes.

11. A method as set forth in claim 1 wherein said marking said selected ones of said nodes includes:
    for each of said instances, determining that a present one of said instances is not at a lowest level of said hierarchy;
    for each of said instances not at said lowest level, converting said present one of said instances into a list of cell level nodes; and
    for each of said cell level nodes, determining that a present one of each of said cell level nodes is an input to a standard cell prior to marking said present one of said cell level nodes.

12. A method as set forth in claim 11 wherein said marking said selected ones of said nodes further includes:
    for each of said objects, determining that a present one of said objects is said present one of said instances.

13. A method as set forth in claim 1 wherein said marking said selected ones of said nodes includes:
    for each of said nodes at a lowest level of said hierarchy, determining that a present one of said nodes is not at an input to a standard cell; and
    marking all inputs for each of said instances which are coupled to said present one of said nodes wherein said present one of said nodes is coupled to an output of a single other one of said instances.

14. A method as set forth in claim 13 wherein said marking said selected ones of said nodes further includes:
    determining that said present one of said nodes is coupled to said output prior to marking said inputs.

15. A method as set forth in claim 1 wherein said marking said selected ones of said nodes includes:
    for each of said nodes at a lowest level of said hierarchy coupled to an output of at least two cells, for each of said at least two cells determining that a present one of said cells has a single output; and, if so,
    marking an input of said present one of said cells.

16. A method as set forth in claim 1 wherein said marking said selected ones of said nodes includes:
    for each of said nodes at a lowest level of said hierarchy coupled to an output of at least two cells, for each of said at least two cells determining that the present one of said cells has at least two outputs; and, if so,
    marking one of said outputs coupled to a present one of said nodes.

17. A method as set forth in claim 1 wherein said marking said selected ones of said nodes includes:
    for each of said nodes at a lowest level of said hierarchy coupled to an output of at least two cells wherein a present one of said cells has a single output, determining that said present one of said cells is sequential; and, if so,
    marking said output of said present one of said cells.

18. A method as set forth in claim 1 wherein said generating said timing model includes:
    defining timing arcs along said timing paths which are contiguous between at least one input and at least one output of said circuit.

19. A method as set forth in claim 18 wherein said defining includes:
    defining a delay arc along a selected one of said timing paths wherein said selected one of said timing paths includes at least one standard cell.

20. A method as set forth in claim 18 wherein said defining includes:
defining a zero delay arc along a selected one of said timing paths wherein said selected one of said timing paths does not include any instance.

21. A method as set forth in claim 18 wherein said defining includes:
defining a delay arc along a selected one of said timing paths wherein said selected one of said timing paths is between one of said selected nodes being a clock input of an instance and an other of said selected nodes being coupled to an output of said instance.

22. A method as set forth in claim 18 wherein said defining includes:
defining a setup arc along a selected one of said timing paths wherein said selected one of said timing paths is between one of said selected nodes being coupled to a clock input of an instance and an other of said selected nodes being coupled to a data input of said instance.

23. A method as set forth in claim 1 wherein said creating exception signatures includes:
defining an exception signature for each respective one of said timing paths included within a single one of said timing exceptions.

24. A method as set forth in claim 1 wherein said removing includes:
defining a first cone from a first one of said selected ones of said nodes and a second cone from a second one of said selected ones of said nodes wherein said first one of said selected ones of said nodes is a starting point for one of said exception signatures and said second one of said selected ones of said nodes is an ending node for said one of said exception signatures, said first cone being defined by vectors emanating from said first one of said selected ones of said nodes to all other ones of said selected nodes for which said timing paths exist ultimately originating from said first one of said selected ones of said nodes, said second cone being defined by vectors terminating at said second one of said selected ones of said nodes from all other ones of said second nodes for which said timing paths ultimately terminate at said second one; and
maintaining in an area inclusive within the intersection of said first cone and said second cone exception signatures identified by originating from and terminating at said first one of said selected ones of said nodes and said second one of said selected ones of said nodes, respectively, and removing said identified signatures from all timing paths wherein said identified timing exceptions are being carried exclusive of said area.

25. A computer readable medium containing a program that when executed reads data containing information relating to a circuit, said circuit including a plurality of objects, said objects having a plurality of instances and a plurality of nodes, said instances and said nodes being disposed in a hierarchy in said circuit, and implements a procedure for hierarchal handling of user inputted timing exceptions within said circuit comprising:
marking selected ones of said nodes;
generating a timing model having a plurality of timing paths wherein each of said timing paths are between any two of said selected ones of said nodes;
creating exception signatures for said timing exceptions to be carried along said timing paths; and
removing extraneous ones of said exception signatures from said timing paths.

26. A procedure as set forth in claim 25 wherein said marking said selected ones of said nodes includes:
for each of said nodes, marking a present one of said nodes wherein said present one of said nodes is at a lowest level of said hierarchy and at an input to any one of said instances.

27. A procedure as set forth in claim 26 wherein said marking said selected ones of said nodes further includes:
determining that said input to said any one of said instances is an input to a standard cell prior to marking said present one of said nodes.

28. A procedure as set forth in claim 26 wherein said marking said selected ones of said nodes further includes:
determining that said present one of said nodes is at said lowest level prior to marking said present one of said nodes.

29. A procedure as set forth in claim 28 wherein said marking said selected ones of said nodes further includes:
determining that said input to said any one of said instances is an input to a standard cell subsequent to said determining that said present one of said nodes is at said lowest level.

30. A procedure as set forth in claim 28 wherein said marking selected ones of said nodes further includes:
for each of said objects, determining that a present one of said objects is said present one of said nodes prior to determining that said present one of said nodes is at said lowest level.

31. A procedure as set forth in claim 25 wherein said marking selected ones of said nodes includes:
for each of said instances, determining that a present one of said instances is at a lowest level of said hierarchy; and, if so,
marking all inputs to said present one of said instances.

32. A procedure as set forth in claim 31 wherein said marking selected ones of said nodes further includes:
for each of said objects, determining that a present one of said objects is said present one of said instances prior to determining that said present one of said instances is at said lowest level.

33. A procedure as set forth in claim 25 wherein said marking said selected ones of said nodes includes:
for each of said nodes, determining that a present one of said nodes is not at a lowest level in said hierarchy;
for each of said nodes not at said lowest level, converting said present one of said nodes into a list of cell level nodes; and
for each of said cell level nodes, determining that a present one of each of said cell level nodes is an input to a standard cell prior to marking said present one of said cell level nodes.

34. A procedure as set forth in claim 33 wherein said marking said selected ones of said nodes further includes:
for each of said objects, determining that a present one of said objects is said present one of said nodes.

35. A procedure as set forth in claim 25 wherein said marking said selected ones of said nodes includes:
for each of said instances, determining that a present one of said instances is not at a lowest level of said hierarchy;
for each of said instances not at said lowest level, converting said present one of said instances into a list of cell level nodes; and
for each of said cell level nodes, determining that a present one of each of said cell level nodes is an input to a standard cell prior to marking said present one of said cell level nodes.

36. A procedure as set forth in claim 35 wherein said marking said selected ones of said nodes further includes:
for each of said objects, determining that a present one of said objects is said present one of said instances.

37. A procedure as set forth in claim 25 wherein said marking said selected ones of said nodes includes:
for each of said nodes at a lowest level of said hierarchy, determining that a present one of said nodes is not at an input to a standard cell; and
marking all inputs for each of said instances which are coupled to said present one of said nodes wherein said present one of said nodes is coupled to an output of a single other one of said instances.

38. A procedure as set forth in claim 37 wherein said marking said selected ones of said nodes further includes:
determining that said present one of said nodes is coupled to said output prior to marking said inputs.

39. A procedure as set forth in claim 25 wherein said marking said selected ones of said nodes includes:
for each of said nodes at a lowest level of said hierarchy coupled to an output of at least two cells, for each of said at least two cells determining that a present one of said cells has a single output; and, if so,
marking an input of said present one of said cells.

40. A procedure as set forth in claim 25 wherein said marking said selected ones of said nodes includes:
for each of said nodes at a lowest level of said hierarchy coupled to an output of at least two cells, for each of said at least two cells determining that the present one of said cells has at least two outputs; and, if so,
marking one of said outputs coupled to a present one of said nodes.

41. A procedure as set forth in claim 25 wherein said marking said selected ones of said nodes includes:
for each of said nodes at a lowest level of said hierarchy coupled to an output of at least two cells wherein a present one of said cells has a single output, determining that said present one of said cells is sequential; and, if so,
marking said output of said present one of said cells.

42. A procedure as set forth in claim 25 wherein said generating said timing model includes:
defining timing arcs along said timing paths which are contiguous between at least one input and at least one output of said circuit.

43. A procedure as set forth in claim 42 wherein said defining includes:
defining a delay arc along a selected one of said timing paths wherein said selected one of said timing paths includes at least one standard cell.

44. A procedure as set forth in claim 42 wherein said defining includes:
defining a zero delay arc along a selected one of said timing paths wherein said selected one of said timing paths does not include any instance.

45. A procedure as set forth in claim 42 wherein said defining includes:
defining a delay arc along a selected one of said timing paths wherein said selected one of said timing paths is between one of said selected nodes being a clock input of an instance and an other of said selected nodes being coupled to an output of said instance.

46. A procedure as set forth in claim 42 wherein said defining includes:
defining a setup arc along a selected one of said timing paths wherein said selected one of said timing paths is between one of said selected nodes being coupled to a clock input of an instance and an other of said selected nodes being coupled to a data input of said instance.

47. A procedure as set forth in claim 25 wherein said creating exception signatures includes:
defining an exception signature for each respective one of said timing paths included within a single one of said timing exceptions.

48. A procedure as set forth in claim 25 wherein said removing includes:
defining a first cone from a first one of said selected ones of said nodes and a second cone from a second one of said selected ones of said nodes wherein said first one of said selected ones of said nodes is a starting point for one of said exception signatures and said second one of said selected ones of said nodes is an ending node for said one of said exception signatures, said first cone being defined by vectors emanating from said first one of said selected ones of said nodes to all other ones of said selected nodes for which said timing paths exist ultimately originating from said first one of said selected ones of said nodes, said second cone being defined by vectors terminating at said second one of said selected ones of said nodes from all other ones of said second nodes for which said timing paths ultimately terminate at said second one; and
maintaining in an area inclusive within the intersection of said first cone and said second cone exception signatures identified by originating from and terminating at said first one of said selected ones of said nodes and said second one of said selected ones of said nodes, respectively, and removing said identified signatures from all timing paths wherein said identified timing exceptions are being carried exclusive of said area.

49. In a computer system including a storage medium, said storage medium having data, said data containing information of a circuit including a plurality of objects, said objects having a plurality of instances and a plurality of nodes, said instances and said nodes being disposed in a hierarchy in said circuit, an apparatus for hierarchal handling of timing exceptions within said circuit comprising:
means for marking selected ones of said nodes;
means for generating a timing model having a plurality of timing paths wherein each of said timing paths are between any two of said selected ones of said nodes;
means for creating exception signatures for said timing exceptions to be carried along said timing paths; and
means for removing extraneous ones of said exception signatures from said timing paths.

50. An apparatus as set forth in claim 49 wherein said means for marking said selected ones of said nodes includes:
for each of said nodes, means for marking a present one of said nodes wherein said present one of said nodes is at a lowest level of said hierarchy and at an input to any one of said instances.

51. An apparatus as set forth in claim 50 wherein said means for marking said selected ones of said nodes further includes:
means for determining that said input to said any one of said instances is an input to a standard cell prior to marking said present one of said nodes.

52. An apparatus as set forth in claim 50 wherein said means for marking said selected ones of said nodes further includes:

means for determining that said present one of said nodes is at said lowest level prior to marking said present one of said nodes.

53. An apparatus as set forth in claim 52 wherein said means for marking said selected ones of said nodes further includes:

means for determining that said input to said any one of said instances is an input to a standard cell in response to said means for determining that said present one of said nodes is at said lowest level.

54. An apparatus as set forth in claim 52 wherein said means for marking selected ones of said nodes further includes:

for each of said objects, means for determining that a present one of said objects is said present one of said nodes in response to said means for determining that said present one of said nodes is at said lowest level.

55. An apparatus as set forth in claim 49 wherein said means for marking selected ones of said nodes includes:

for each of said instances, means for determining that a present one of said instances is at a lowest level of said hierarchy; and, if so, means for marking all inputs to said present one of said instances.

56. An apparatus as set forth in claim 55 wherein said means for marking selected ones of said nodes further includes:

for each of said objects, means for determining that a present one of said objects is said present one of said instances in response to said means for determining that said present one of said instances is at said lowest level.

57. An apparatus as set forth in claim 49 wherein said means for marking said selected ones of said nodes includes:

for each of said nodes, means for determining that a present one of said nodes is not at a lowest level in said hierarchy;

for each of said nodes not at said lowest level, means for converting said present one of said nodes into a list of cell level nodes; and for each of said cell level nodes, means for determining that a present one of each of said cell level nodes is an input to a standard cell in response to said means for marking said present one of said cell level nodes.

58. An apparatus as set forth in claim 57 wherein said means for marking said selected ones of said nodes further includes:

for each of said objects, means for determining that a present one of said objects is said present one of said nodes.

59. An apparatus as set forth in claim 49 wherein said means for marking said selected ones of said nodes includes:

for each of said instances, means for determining that a present one of said instances is not at a lowest level of said hierarchy;

for each of said instances not at said lowest level, means for converting said present one of said instances into a list of cell level nodes; and for each of said cell level nodes, means for determining that a present one of each of said cell level nodes is an input to a standard cell in response to said means for marking said present one of said cell level nodes.

60. An apparatus as set forth in claim 59 wherein said means for marking said selected ones of said nodes further includes:

for each of said objects, means for determining that a present one of said objects is said present one of said instances.

61. An apparatus as set forth in claim 49 wherein said means for marking said selected ones of said nodes includes:

for each of said nodes at a lowest level of said hierarchy, means for determining that a present one of said nodes is not at an input to a standard cell; and means for marking all inputs for each of said instances which are coupled to said present one of said nodes wherein said present one of said nodes is coupled to an output of a single other one of said instances.

62. An apparatus as set forth in claim 61 wherein said means for marking said selected ones of said nodes further includes:

means for determining that said present one of said nodes is coupled to said output prior to marking said inputs.

63. An apparatus as set forth in claim 49 wherein said means for marking said selected ones of said nodes includes:

for each of said nodes at a lowest level of said hierarchy coupled to an output of at least two cells, for each of said at least two cells means for determining that a present one of said cells has a single output; and, if so, means for marking an input of said present one of said cells.

64. An apparatus as set forth in claim 49 wherein said means for marking said selected ones of said nodes includes:

for each of said nodes at a lowest level of said hierarchy coupled to an output of at least two cells, for each of said at least two cells means for determining that the present one of said cells has at least two outputs; and, if so, means for marking one of said outputs coupled to a present one of said nodes.

65. An apparatus as set forth in claim 49 wherein said means for marking said selected ones of said nodes includes:

for each of said nodes at a lowest level of said hierarchy coupled to an output of at least two cells wherein a present one of said cells has a single output, means for determining that said present one of said cells is sequential; and, if so, means for marking said output of said present one of said cells.

66. An apparatus as set forth in claim 49 wherein said means for generating said timing model includes:

means for defining timing arcs along said timing paths which are contiguous between at least one input and at least one output of said circuit.

67. An apparatus as set forth in claim 66 wherein said means for defining includes:

means for defining a delay arc along a selected one of said timing paths wherein said selected one of said timing paths includes at least one standard cell.

68. An apparatus as set forth in claim 66 wherein said means for defining includes:

means for defining a zero delay arc along a selected one of said timing paths wherein said selected one of said timing paths does not include any instance.

69. An apparatus as set forth in claim 66 wherein said means for defining includes:

means for defining a delay arc along a selected one of said timing paths wherein said selected one of said timing paths is between one of said selected nodes being a clock input of an instance and an other of said selected nodes being coupled to an output of said instance.

70. An apparatus as set forth in claim 66 wherein said means for defining includes:

means for defining a setup arc along a selected one of said timing paths wherein said selected one of said timing paths is between one of said selected nodes being coupled to a clock input of an instance and an other of said selected nodes being coupled to a data input of said instance.

71. An apparatus as set forth in claim 49 wherein said means for creating exception signatures includes:
means for defining an exception signature for each respective one of said timing paths included within a single one of said timing exceptions.

72. An apparatus as set forth in claim 49 wherein said means for removing includes:
means for defining a first cone from a first one of said selected ones of said nodes and a second cone from a second one of said selected ones of said nodes wherein said first one of said selected ones of said nodes is a starting point for one of said exception signatures and said second one of said selected ones of said nodes is an ending node for said one of said exception signatures, said first cone being defined by vectors emanating from said first one of said selected ones of said nodes to all other ones of said selected nodes for which said timing paths exist ultimately originating from said first one of said selected ones of said nodes, said second cone being defined by vectors terminating at said second one of said selected ones of said nodes from all other ones of said second nodes for which said timing paths ultimately terminate at said second one; and
means for maintaining in an area inclusive within the intersection of said first cone and said second cone exception signatures identified by originating from and terminating at said first one of said selected ones of said nodes and said second one of said selected ones of said nodes, respectively, and removing said identified signatures from all timing paths wherein said identified timing exceptions are being carried exclusive of said area.

73. A computer system for hierarchal handling of timing exceptions comprising:
a computer workstation including a user interface having at least a display monitor and an input device;
a storage medium usable by said workstation, said medium including data readable by said workstation and program code readable and executable by said workstation;
said data containing information of a circuit including a plurality of instances and a plurality of nodes, said instances and said nodes being disposed in a hierarchy in said circuit; and
said program code causing said circuit to be displayed on said monitor and further causing said input device to be responsive to a user inputted timing exceptions within said circuit when displayed;
said program code in response to said timing exceptions being inputted further causing said workstation to mark selected ones of said nodes;
said program code in response to said selected ones of said nodes being marked causing said workstation to generate a timing model having a plurality of timing paths wherein each of said timing paths are between any two of said selected ones of said nodes;
said program code in response to said timing model being generated causing said workstation to create exception signatures for said timing exceptions to be carried along said timing paths; and
said program code in response to said exception signatures being created causing said workstation to remove extraneous ones of said exception signatures from said timing paths.

74. A system as set forth in claim 73 wherein said selected ones of said nodes include each of said nodes at a lowest level of said hierarchy and at an input to one of said instances.

75. A system as set forth in claim 74 wherein said one of said instances is a standard cell.

76. A system as set forth in claim 73 wherein said selected ones of said nodes includes all inputs to each of said instances being at a lowest level in said hierarchy.

77. A system as set forth in claim 73 wherein said selected ones of said nodes includes an input to a standard cell coupled to one of said nodes at a level in said hierarchy other than a lowest level in said hierarchy.

78. A system as set forth in claim 73 wherein said selected ones of said nodes includes all inputs to each of said instances coupled to one of said nodes at a level in said hierarchy other than a lowest level in said hierarchy , said one of said nodes being further coupled to an output of a single other one of said instances.

79. A system as set forth in claim 73 wherein said selected ones of said nodes includes an input of one of said cells having a single output coupled to each of one of said nodes at a lowest level of said hierarchy and an output of at least one other one of said cells.

80. A system as set forth in claim 73 wherein said selected ones-of said nodes include one output of a cell having a plurality of outputs wherein said one output is coupled to each of one of said nodes at a lowest level of said hierarchy and an output of at least one other of said cells.

81. A system as set forth in claim 73 wherein said selected one of said nodes includes an output of a sequential one of a single output one of said cells, said output being further coupled to each of one of said nodes at a lowest level of said hierarchy and an output of at least one other one of said cells.

82. A system as set forth in claim 73 wherein said timing model includes timing arcs along said timing paths contiguous between at least one input and at least one output of said circuit.

83. A system as set forth in claim 82 wherein one of said timing arcs is a delay arc along a selected one of said timing paths, said selected one of said timing paths including at least one standard cell.

84. A system as set forth in claim 82 wherein one of said timing arcs is a zero delay arc along a selected one of said timing paths wherein said selected one of said timing paths does not include any instance.

85. A system as set forth in claim 82 wherein one of said timing arcs is a delay arc along a selected one of said timing paths wherein said selected one of said timing paths is between one of said selected nodes being a clock input of an instance and an other of said selected nodes being coupled to an output of said instance.

86. A system as set forth in claim 85 wherein one of said timing arcs is a setup arc along a selected one of said timing paths wherein said selected one of said timing paths is between one of said selected nodes being coupled to a clock input of an instance and an other of said selected nodes being coupled to a data input of said instance.

87. A system as set forth in claim 73 wherein each of said timing exceptions includes an exception signature for each respective one of said timing paths included within a single one of said timing exceptions.

88. A system as set forth in claim 73 wherein a first cone is defined from a first one of said selected ones of said nodes and a second cone is defined from a second one of said selected ones of said nodes wherein said first one of said selected ones of said nodes is a starting point for one of said exception signatures and said second one of said selected ones of said nodes is an ending node for said one of said exception signatures, said first cone being defined by vectors emanating from said first one of said selected ones of said nodes to all other ones of said selected nodes for which said timing paths exist ultimately originating from said first one of said selected ones of said nodes, said second cone being defined by vectors terminating at said second one of said selected ones of said nodes from all other ones of said second nodes for which said timing paths ultimately terminate at said second one, said exception signatures identified as originating from and terminating at said first one of said selected ones of said nodes and said second one of said selected ones of said nodes being maintained in an area inclusive within the intersection of said first cone and said second cone, respectively, and said identified signatures being removed from all timing paths wherein said identified timing exceptions are being carried exclusive of said area.

* * * * *